(12) United States Patent
Iizuka et al.

(10) Patent No.: US 10,840,116 B2
(45) Date of Patent: Nov. 17, 2020

(54) WAFER PRODUCING APPARATUS

(71) Applicant: DISCO CORPORATION, Tokyo (JP)

(72) Inventors: Kentaro Iizuka, Tokyo (JP); Naoki Omiya, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/661,499

(22) Filed: Oct. 23, 2019

(65) Prior Publication Data
US 2020/0130106 A1  Apr. 30, 2020

(30) Foreign Application Priority Data

Oct. 29, 2018 (JP) .................. 2018-202449

(51) Int. Cl.
*B23K 26/53* (2014.01)
*B23K 26/38* (2014.01)
(Continued)

(52) U.S. Cl.
CPC .... *H01L 21/67155* (2013.01); *B23K 26/0006* (2013.01); *B23K 26/0093* (2013.01); *B23K 26/083* (2013.01); *B23K 26/0838* (2013.01); *B23K 26/0869* (2013.01); *B23K 26/10* (2013.01); *B23K 26/38* (2013.01); *B23K 26/53* (2015.10); *B24B 7/228* (2013.01); *B24B 27/0069* (2013.01); *B28D 5/0082* (2013.01); *H01L 21/304* (2013.01); *H01L 21/6732* (2013.01); *H01L 21/6773* (2013.01); *H01L 21/67173* (2013.01); *H01L 21/67219* (2013.01); *H01L 21/67346* (2013.01); *H01L 21/67706* (2013.01); *H01L 21/67766* (2013.01); *H01L 21/67769* (2013.01); *H01L 21/67778* (2013.01);

(Continued)

(58) Field of Classification Search
CPC .... B23K 26/53; B23K 2103/56; B23K 26/38; B23K 26/0838; B23K 2101/40; B23K 26/0093; H01L 21/673–67396; H01L 21/6732; H01L 21/67–67796
USPC .................. 206/712; 438/463, 464; 269/903, 269/289 R–289 MR, 9–10, 37–45, 287; 211/41.18

See application file for complete search history.

(56) References Cited

U.S. PATENT DOCUMENTS 3,469,686 A * 9/1969 Gutsche ............ H01L 21/67346
                                                          206/712
4,309,600 A * 1/1982 Perry .................... B23Q 3/157
                                                          235/375

(Continued)

FOREIGN PATENT DOCUMENTS

| JP | 2000094221 A | 4/2000 |
| JP | 2013049161 A | 3/2013 |

(Continued)

*Primary Examiner* — Erica E Cadugan
(74) *Attorney, Agent, or Firm* — Greer Burns & Crain Ltd.

(57) ABSTRACT

A wafer producing apparatus includes an ingot grinding unit that grinds the upper surface of an ingot to planarize the upper surface, a laser irradiation unit that positions the focal point of a laser beam with such a wavelength as to be transmitted through the ingot to a depth corresponding to the thickness of a wafer to be produced from the upper surface of the ingot and irradiates the ingot with the laser beam to form a separation layer, a wafer separating unit that separates the wafer from the ingot, and a tray having a support part that supports the separated wafer.

3 Claims, 19 Drawing Sheets

(51) Int. Cl.
*B23K 26/08* (2014.01)
*H01L 21/673* (2006.01)
*H01L 21/677* (2006.01)
*H01L 21/304* (2006.01)
*B28D 5/00* (2006.01)
*B24B 7/22* (2006.01)
*H01L 21/67* (2006.01)
*B23K 26/10* (2006.01)
*B23K 26/00* (2014.01)
*B24B 27/00* (2006.01)
*B24D 3/00* (2006.01)
*B23K 101/40* (2006.01)
*B23K 103/00* (2006.01)

(52) U.S. Cl.
CPC ...... *B23K 2101/40* (2018.08); *B23K 2103/56* (2018.08); *B24D 3/00* (2013.01); *H01L 21/67092* (2013.01); *Y10T 29/5139* (2015.01); *Y10T 29/5143* (2015.01); *Y10T 29/5196* (2015.01)

(56) References Cited

U.S. PATENT DOCUMENTS

| | | | | |
|---|---|---|---|---|
| 4,407,262 A | * | 10/1983 | Wirz | B23D 59/008 |
| | | | | 125/13.01 |
| 4,946,021 A | * | 8/1990 | Murphy | B23Q 1/525 |
| | | | | 198/375 |
| 5,355,579 A | * | 10/1994 | Miyasaka | B23P 21/00 |
| | | | | 198/464.4 |
| 6,261,370 B1 | * | 7/2001 | Otsuki | H01L 21/67333 |
| | | | | 118/500 |
| 6,361,313 B1 | * | 3/2002 | Beyaert | G03F 7/70691 |
| | | | | 211/41.18 |
| 9,981,339 B2 | * | 5/2018 | Hirata | B24B 7/228 |
| 10,573,505 B2 | * | 2/2020 | Hirata | H01L 21/02013 |
| 2014/0374390 A1 | * | 12/2014 | Beransky | B23K 37/0235 |
| | | | | 219/121.7 |
| 2015/0038062 A1 | * | 2/2015 | Umeda | B23K 26/53 |
| | | | | 451/70 |
| 2016/0074960 A1 | * | 3/2016 | Hirata | H01L 21/02008 |
| | | | | 225/2 |
| 2016/0152508 A1 | * | 6/2016 | Kumkar | B23K 26/40 |
| | | | | 428/43 |
| 2016/0158882 A1 | * | 6/2016 | Hirata | H01L 21/78 |
| | | | | 125/23.01 |
| 2017/0053829 A1 | * | 2/2017 | Hirata | H01L 23/544 |
| 2017/0087671 A1 | * | 3/2017 | Tanaka | B23K 26/064 |
| 2017/0301549 A1 | * | 10/2017 | Suzuki | B24B 27/06 |
| 2019/0181024 A1 | * | 6/2019 | Iizuka | H01L 21/67092 |
| 2019/0221436 A1 | * | 7/2019 | Hirata | B24B 27/0076 |

FOREIGN PATENT DOCUMENTS

| | | | |
|---|---|---|---|
| JP | 2013-179237 A | * | 9/2013 |
| JP | 2013-229508 A | * | 11/2013 |

* cited by examiner

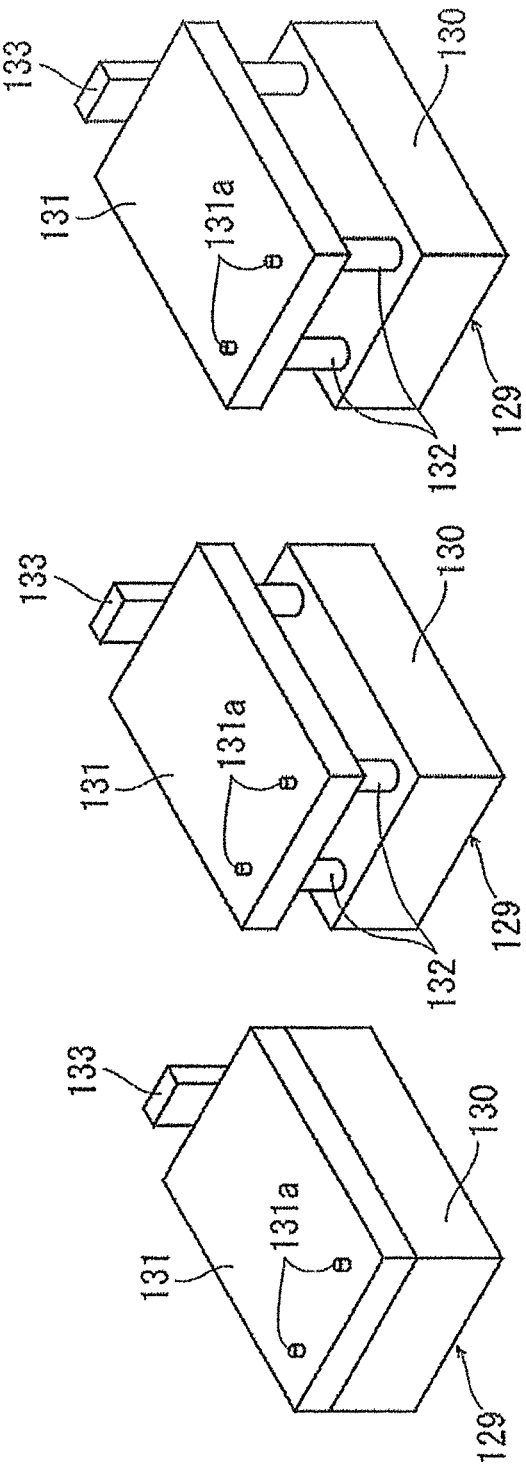

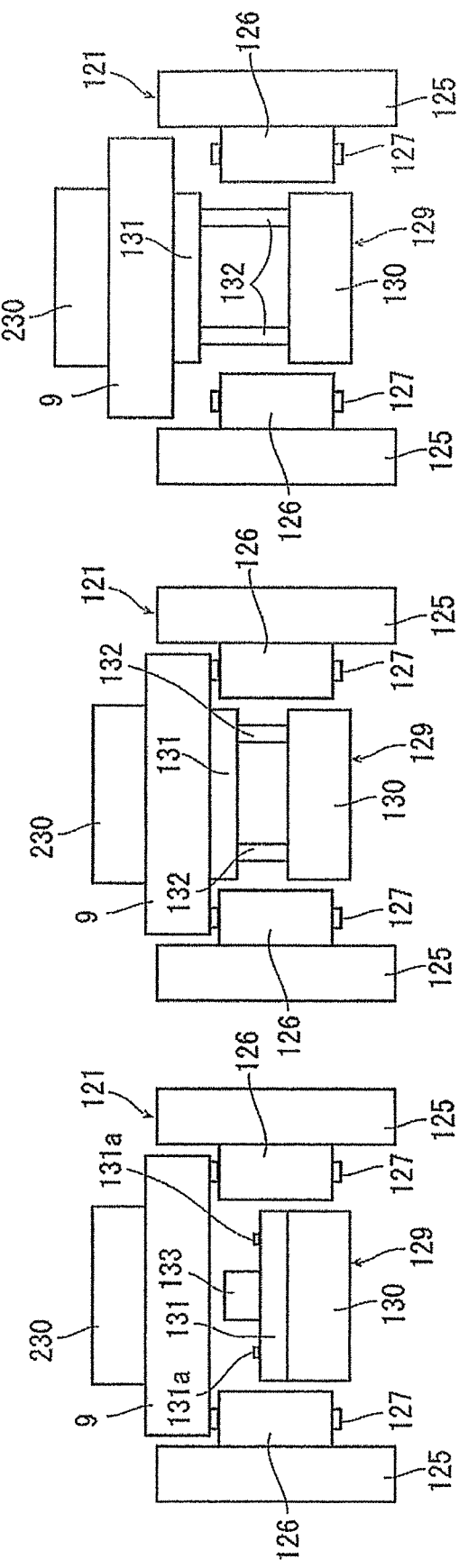

WAFER PRODUCING APPARATUS

BACKGROUND OF THE INVENTION

Field of the Invention

The present invention relates to a wafer producing apparatus that produces wafers from an ingot.

Description of the Related Art

Devices such as an integrated circuit (IC), large scale integration (LSI), and a light emitting diode (LED) are formed as follows. Specifically, a functional layer is stacked over a surface of a wafer whose material is silicon (Si), sapphire ($Al_2O_3$), or the like and the devices are formed based on this functional layer in such a manner as to be marked out by plural intersecting planned dividing lines. Furthermore, power device, an LED, and so forth are formed as follows. Specifically, a functional layer is stacked over a surface of a wafer whose material is single-crystal silicon carbide (SiC) and these devices are formed based on this functional layer in such a manner as to be marked out by plural intersecting planned dividing lines. The wafer over which devices have been formed is divided into individual device chips through execution of processing for the planned dividing lines by a cutting apparatus or a laser processing apparatus, and the respective divided device chips are used for pieces of electrical equipment such as mobile phones and personal computers.

The wafer over which devices are to be formed is produced by thinly cutting an ingot with a circular column shape by a wire saw generally. The front surface and back surface of the cut wafer are finished into mirror surfaces by polishing (for example, refer to Japanese Patent Laid-open No. 2000-94221). However, when an ingot is cut by a wire saw and the front surface and back surface of the cut wafer are polished, there is a problem that most part (70% to 80%) of the ingot is discarded and this is uneconomic. In particular, in the case of a hexagonal single-crystal SiC ingot, the hardness is high and cutting by the wire saw is difficult and needs a considerable time. Therefore, the productivity is low. In addition, the unit cost of the ingot is high and there is a challenge in efficiently producing wafers.

Thus, a technique has been proposed in which the focal point of a laser beam with such a wavelength as to be transmitted through hexagonal single-crystal SiC is positioned inside a hexagonal single-crystal SiC ingot and the hexagonal single-crystal SiC ingot is irradiated with the laser beam to form a separation layer at a planned cutting plane and a wafer is separated from the hexagonal single-crystal SiC ingot along the planned cutting plane at which the separation layer is formed (for example, refer to Japanese Patent Laid-open No. 2013-49161).

SUMMARY OF THE INVENTION

However, a step of forming a separation layer in an ingot, a step of separating a wafer from the ingot, and a step of grinding the upper surface of the ingot to planarize the upper surface are executed through manpower and there is a problem that the production efficiency is low.

Thus, an object of the present invention is to provide a wafer producing apparatus that can automatically produce wafers from an ingot.

In accordance with an aspect of the present invention, there is provided a wafer producing apparatus that produces a wafer from an ingot. The wafer producing apparatus includes an ingot grinding unit including a first holding table that holds the ingot and grinding means that grinds an upper surface of the ingot held by the first holding table to planarize the upper surface, a laser irradiation unit including a second holding table that holds the ingot and laser irradiation means that positions a focal point of a laser beam with such a wavelength as to be transmitted through the ingot to a depth corresponding to a thickness of a wafer to be produced from the upper surface of the ingot held by the second holding table and irradiates the ingot with the laser beam to form a separation layer, and a wafer separating unit including a third holding table that holds the ingot and wafer separating means that holds the upper surface of the ingot held by the third holding table and separates a wafer from the separation layer. The wafer producing apparatus includes also a tray including an ingot support part that supports the ingot and a wafer support part that supports the separated wafer, a belt conveyor unit that conveys the ingot supported by the tray among the ingot grinding unit, the laser irradiation unit, and the wafer separating unit, an ingot stocker in which the ingot supported by the tray is housed, and an ingot delivery unit that delivers the ingot supported by the tray housed in the ingot stocker to the belt conveyor unit.

Preferably, the ingot stocker includes a placement table on which the tray that supports the ingot is placed, a first endless belt that is disposed in the placement table and sends out the tray that supports the ingot, a driving force transmitting part that is joined to the first endless belt and transmits a driving force, and a rack in which a plurality of the placement tables are disposed vertically, and the ingot delivery unit includes a receiving table that receives the tray that supports the ingot from the placement table, a second endless belt that is disposed in the receiving table and delivers the tray that supports the ingot to the belt conveyor unit, a motor that drives the second endless belt, a clutch part that is joined to the second endless belt and transmits a driving force to the driving force transmitting part, and an elevator that positions the receiving table to any of the plurality of the placement tables disposed vertically. Preferably, the wafer producing apparatus further includes a cassette stocker in which a plurality of cassettes that house the separated wafers are housed, and housing means that causes the wafer supported by the wafer support part of the tray to be housed in the cassette housed in the cassette stocker.

According to the wafer producing apparatus of the present invention, a series of work of producing the wafer from the ingot can be automatically executed and the production efficiency is improved.

The above and other objects, features and advantages of the present invention and the manner of realizing them will become more apparent, and the invention itself will best be understood from a study of the following description and appended claims with reference to the attached drawings showing a preferred embodiment of the invention.

BRIEF DESCRIPTION OF THE DRAWINGS

FIG. 10A is a perspective view of a tray stopper in the state in which a rising-lowering plate is located at a passing position;

FIG. 10B is a perspective view of the tray stopper in the state in which the rising-lowering plate is located at a stop position;

FIG. 10C is a perspective view of the tray stopper in the state in which the rising-lowering plate is located at a separation position;

FIG. 11A is a sectional view of the tray stopper and so forth corresponding to the state depicted in FIG. 10A;

FIG. 11B is a sectional view of the tray stopper and so forth corresponding to the state depicted in FIG. 10B;

FIG. 11C is a sectional view of the tray stopper and so forth corresponding to the state depicted in FIG. 10C;

DETAILED DESCRIPTION OF THE PREFERRED EMBODIMENT

Figure 1:
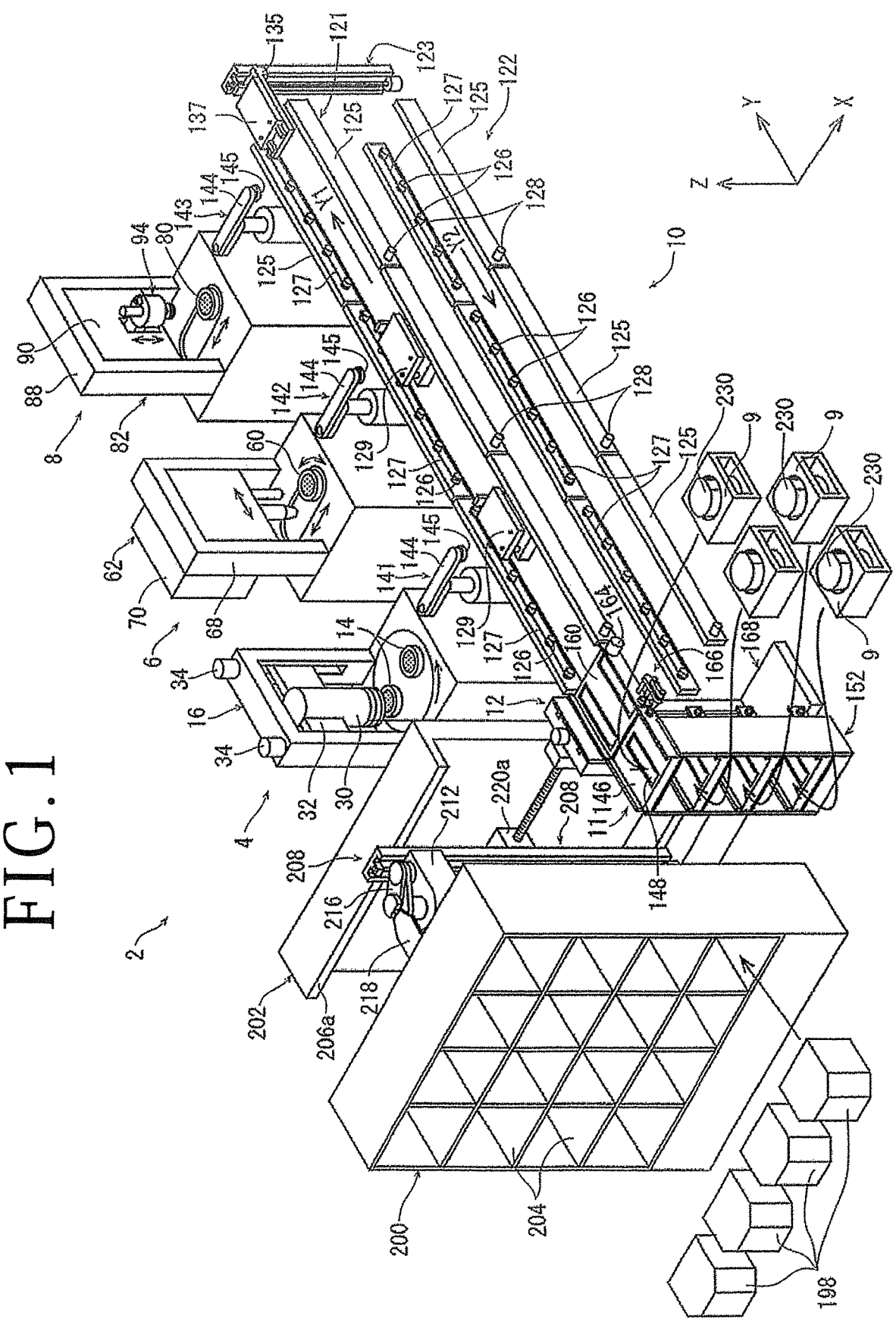
FIG. 1 is a perspective view of a wafer producing apparatus of an embodiment of the present invention.

A wafer producing apparatus of an embodiment of the present invention will be described in detail below with reference to the drawings. A wafer producing apparatus 2 depicted in FIG. 1 is composed of at least an ingot grinding unit 4, a laser irradiation unit 6, a wafer separating unit 8, a tray 9 including an ingot support part that supports an ingot and a wafer support part that supports a separated wafer, a belt conveyor unit 10 that conveys the ingot supported by the tray 9 among the ingot grinding unit 4, the laser irradiation unit 6, and the wafer separating unit 8, an ingot stocker 11 that houses the ingot supported by the tray 9, and an ingot delivery unit 12 that delivers the ingot supported by the tray 9 housed in the ingot stocker 11 to the belt conveyor unit 10.

The ingot grinding unit 4 will be described with reference to FIG. 2. The ingot grinding unit 4 is composed of at least a first holding table 14 that holds an ingot and has a circular shape and grinding means 16 that grinds the upper surface of an ingot held by the first holding table 14 to planarize the upper surface. The ingot grinding unit 4 in the present embodiment includes a base 18 with a rectangular parallelepiped shape and a circular turn table 20 rotatably mounted on the upper surface of the base 18. The turn table 20 is rotated by a motor for the turn table (not depicted) incorporated in the base 18, with the center of rotation being an axis line that passes through the center of the turn table 20 in the radial direction and extends in a Z-axis direction. Furthermore, in the present embodiment, a pair of first holding tables 14 are rotatably mounted on the upper surface of the turn table 20 and are disposed with point symmetry, with the point of symmetry being the center of the turn table 20 in the radial direction (center of rotation). The first holding tables 14 are alternately positioned to a grinding position at which grinding processing is executed by the grinding means 16 (position on the far side in FIG. 2) and an ingot attaching/detaching position for attaching/detaching an ingot (position on the near side in FIG. 2) by rotation of the turn table 20.

The first holding table 14 is rotated by a motor for the first holding table (not depicted) mounted on the lower surface of the turn table 20, with the center of rotation being an axis line that passes through the center of the first holding table 14 in the radial direction and extends in the Z-axis direction. Furthermore, a porous suction adhesion chuck 22 connected to suction means (not depicted) is disposed on the upper surface of the first holding table 14. In the first holding table 14, an ingot placed on the upper surface of the suction adhesion chuck 22 is sucked and held by producing a suction force for the upper surface of the suction adhesion chuck 22 by the suction means. The Z-axis direction is the upward-downward direction represented by an arrow Z in FIG. 2. Moreover, an X-axis direction represented by an arrow X in FIG. 2 is a direction orthogonal to the Z-axis direction and a Y-axis direction represented by an arrow Y in FIG. 2 is a direction orthogonal to the X-axis direction and the Z-axis direction. The plane defined by the X-axis direction and the Y-axis direction is substantially horizontal.

Figure 2:
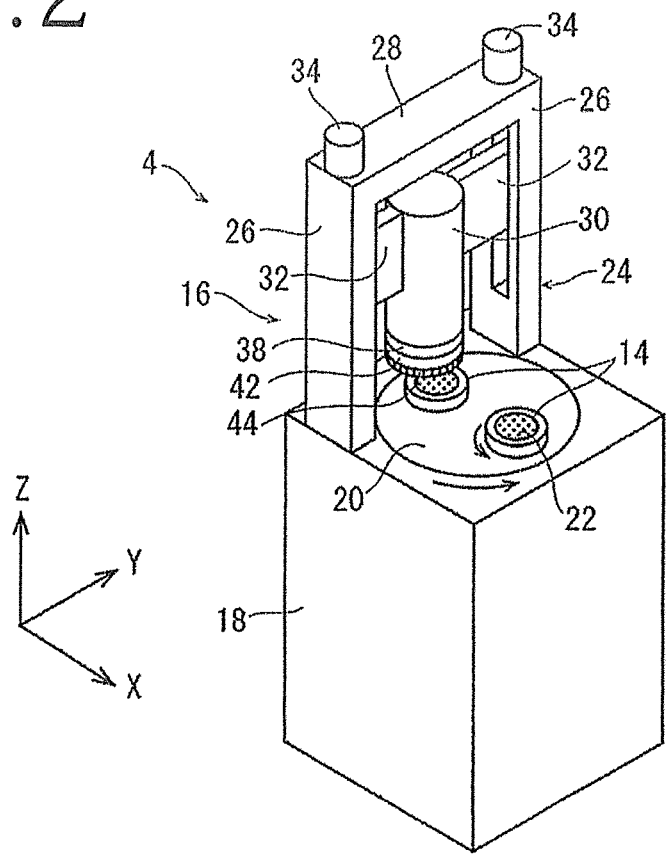
FIG. 2 is a perspective view of an ingot grinding unit depicted in FIG. 1.

In the present embodiment, as depicted in FIG. 2, the grinding means 16 of the ingot grinding unit 4 includes a gate-shaped support frame 24 mounted on the upper surface of the base 18. The support frame 24 has a pair of support columns 26 that extend upward from the upper surface of the base 18 with the intermediary of an interval in the Y-axis direction and a beam 28 that is stretched between the upper ends of the support columns 26 and extends in the Y-axis direction. A spindle housing 30 is supported by the pair of support columns 26 with the intermediary of a pair of joining pieces 32 movably in the Z-axis direction (movably up and down). A pair of motors 34 for raising and lowering for causing the spindle housing 30 to move in the Z-axis direction (move up and down) are mounted on the upper surface of the beam 28. The motor 34 for raising and lowering is joined to a single end part of a ball screw (not depicted) that extends in the Z-axis direction inside the support column 26 and a nut part (not depicted) of the ball screw is fixed to the joining piece 32. Furthermore, rotational motion of the motor 34 for raising and lowering is converted to linear motion by the ball screw and is transmitted to the joining piece 32, and thereby the spindle housing 30 is raised and lowered.

Figure 3:
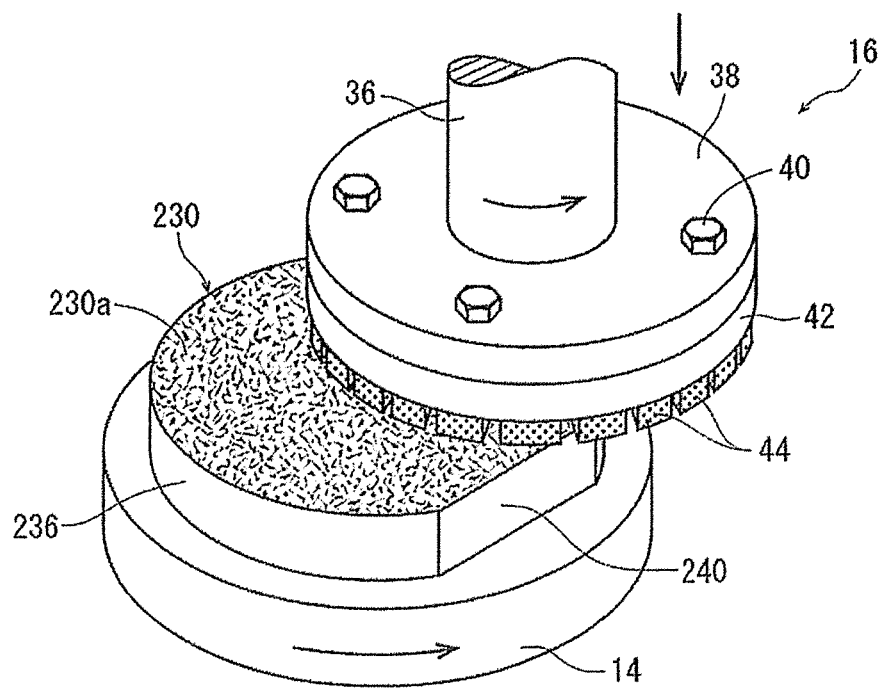
FIG. 3 is a partially enlarged perspective view of the ingot grinding unit depicted in FIG. 2.

A spindle 36 (see FIG. 3) is supported by the spindle housing 30 rotatably around an axis line that extends in the Z-axis direction and this spindle 36 is rotated around the axis line that extends in the Z-axis direction by a motor for the spindle (not depicted) incorporated in the spindle housing 30. A wheel mount 38 with a circular disc shape is fixed to the lower end of the spindle 36 and a ring-shaped grinding wheel 42 is fixed to the lower surface of the wheel mount 38 by bolts 40. To the outer circumferential edge part of the lower surface of the grinding wheel 42, plural grinding abrasives 44 disposed in a ring manner at intervals in the circumferential direction are fixed. As depicted in FIG. 3, when the first holding table 14 is positioned at the grinding position, the center of rotation of the grinding wheel 42 is displaced with respect to the center of rotation of the first holding table 14 in such a manner that the grinding abrasives 44 pass through the center of rotation of the first holding table 14. For this reason, in the grinding means 16, the whole of the upper surface of an ingot can be planarized through grinding by the grinding abrasives 44 by bringing the upper surface of the ingot held by the first holding table 14 into contact with the grinding abrasives 44 while mutually rotating the first holding table 14 and the grinding wheel 42.

The laser irradiation unit 6 will be described with reference to FIG. 1 to FIG. 4. As depicted in FIG. 1, the laser irradiation unit 6 disposed adjacent to the ingot grinding unit 4 is composed of at least a second holding table 60 that holds an ingot and has a circular shape and laser irradiation means 62 that positions the focal point of a laser beam with such a wavelength as to be transmitted through the ingot to a depth corresponding to the thickness of the wafer to be produced from the upper surface of the ingot held by the second holding table 60 and irradiates the ingot with the laser beam to form a separation layer.

Figure 4:
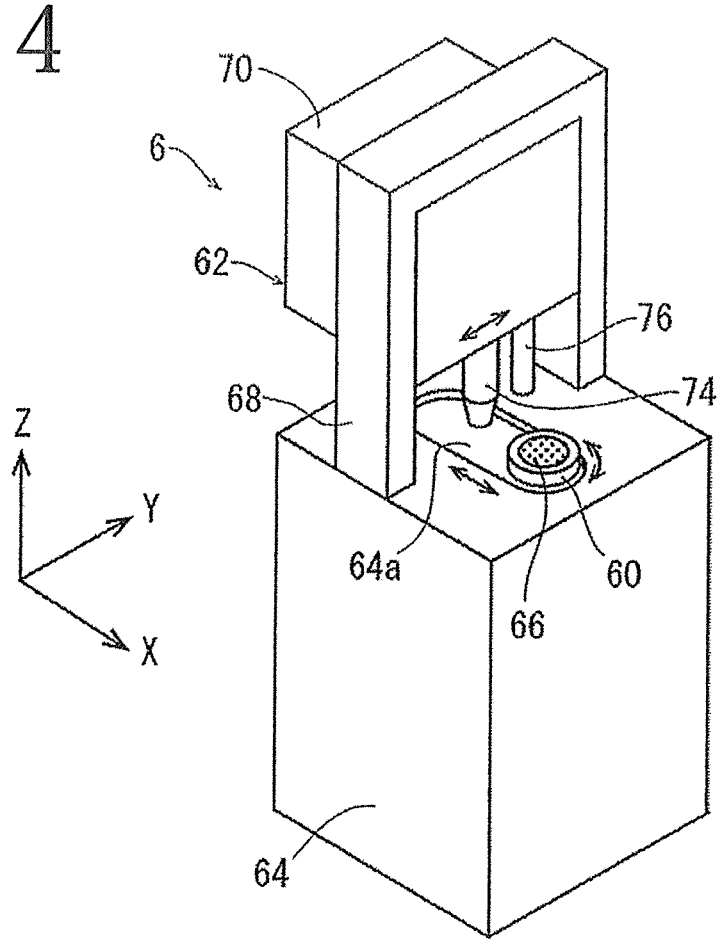
FIG. 4 is a perspective view of a laser irradiation unit depicted in FIG. 1.

In the present embodiment, as depicted in FIG. 4, the laser irradiation unit 6 includes a base 64 with a rectangular parallelepiped shape and a mounting recess 64a that hollows downward and extends in the X-axis direction is formed in the upper surface of this base 64. Furthermore, the second holding table 60 in the present embodiment is mounted in the mounting recess 64a of the base 64 movably in the X-axis direction and rotatably around an axis line that extends in the Z-axis direction. Moreover, the base 64 is equipped with X-axis feed means (not depicted) that moves the second holding table 60 in the X-axis direction along the mounting recess 64a and a motor for the second holding table (not depicted) that rotates the second holding table 60 around an axis line that passes through the center of the second holding table 60 in the radial direction and extends in the Z-axis direction. It suffices for the X-axis feed means to be a configuration having a ball screw that is joined to the second holding table 60 and extends in the X-axis direction and a motor that rotates this ball screw, for example. The motor for the second holding table is moved in the X-axis direction by the X-axis feed means together with the second holding table 60. Therefore, even when the second holding table 60 is moved in the X-axis direction by the X-axis feed means, the motor for the second holding table rotates the second holding table 60. In addition, a porous suction adhesion chuck 66 connected to suction means (not depicted) is disposed on the upper surface of the second holding table 60. In the second holding table 60, an ingot placed on the upper surface of the suction adhesion chuck 66 is sucked and held by producing a suction force for the upper surface of the suction adhesion chuck 66 by the suction means.

As depicted in FIG. 4, the laser irradiation means 62 of the laser irradiation unit 6 includes a gate-shaped support frame 68 mounted on the upper surface of the base 64, a casing 70 supported inside the support frame 68, a Y-axis movable member (not depicted) mounted on the lower end side of the casing 70 movably in the Y-axis direction, and Y-axis feed means (not depicted) that moves the Y-axis movable member in the Y-axis direction. It suffices for the Y-axis feed means to be a configuration having a ball screw that is joined to the Y-axis movable member and extends in the Y-axis direction and a motor that rotates this ball screw, for example.

Figure 5:
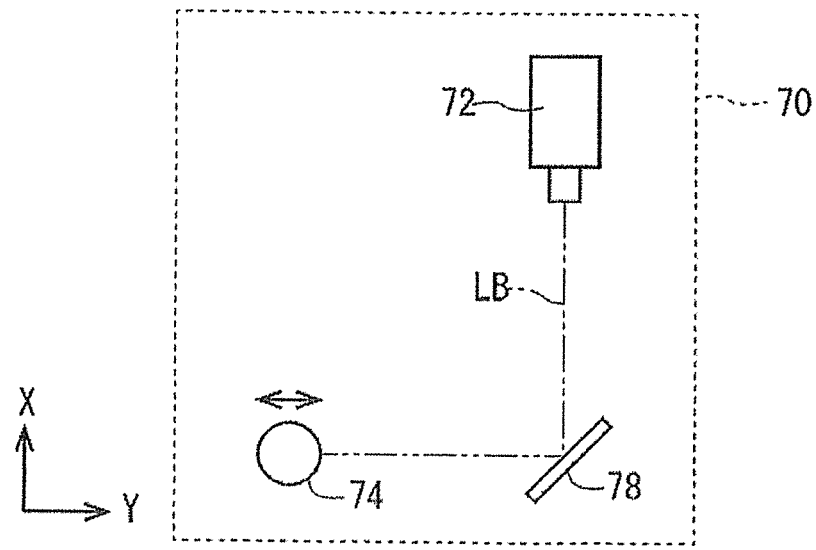
FIG. 5 is a block diagram of laser irradiation means depicted in FIG. 4.

Referring to FIG. 5 in conjunction with FIG. 4, the laser irradiation means 62 further includes a laser oscillator 72 (see FIG. 5) incorporated in the casing 70, a light collector or a condenser 74 (see FIG. 4 and FIG. 5) mounted on the lower end side of the Y-axis movable member movably up and down, alignment means 76 (see FIG. 4) mounted on the lower end side of the Y-axis movable member with the intermediary of an interval from the light collector 74 in the Y-axis direction, and focal point position adjustment means (not depicted) that raises and lowers the light collector 74 to adjust the position in the Z-axis direction regarding the focal point of a pulse laser beam LB collected by the light collector 74. The laser oscillator 72 oscillates a pulse laser with such a wavelength as to be transmitted through the ingot and the pulse laser beam LB is emitted from the laser oscillator 72. The light collector 74 has a collecting lens (not depicted) that collects the pulse laser beam LB emitted from the laser oscillator 72. The alignment means 76 images the ingot held by the second holding table 60 and detects the region to be subjected to laser processing. It suffices for the focal point position adjustment means to be a configuration having a ball screw that is joined to the light collector 74 and extends in the Z-axis direction and a motor that rotates this ball screw, for example.

As depicted in FIG. 5, the following mirrors are incorporated in the casing 70: a first mirror 78 that is disposed with the intermediary of an interval from the laser oscillator 72 in the X-axis direction and reflects the pulse laser beam LB emitted from the laser oscillator 72, with the optical axis set along the X-axis direction, to convert the direction of the optical axis to the Y-axis direction; and a second mirror (not depicted) that is disposed above the light collector 74 with the intermediary of an interval from the first mirror 78 in the Y-axis direction and converts the direction of the optical path of the pulse laser beam LB reflected by the first mirror 78 from the Y-axis direction to the Z-axis direction to guide the pulse laser beam LB to the light collector 74.

The second mirror is mounted on the Y-axis movable member and moves in the Y-axis direction together with the light collector 74 and the alignment means 76 when the Y-axis movable member is moved by the Y-axis feed means. Furthermore, the pulse laser beam LB emitted from the laser oscillator 72, with the optical path set along the X-axis direction, is subjected to conversion of the direction of the optical path from the X-axis direction to the Y-axis direction by the first mirror 78 and is guided to the second mirror.

Subsequently, the direction of the optical path is converted from the Y-axis direction to the Z-axis direction by the second mirror and the pulse laser beam LB is guided to the light collector 74. Then, the pulse laser beam LB is collected by the collecting lens of the light collector 74 and is applied to the ingot held by the second holding table 60. Furthermore, even when the light collector 74 is moved in the Y-axis direction by moving the Y-axis movable member by the Y-axis feed means and even when the light collector 74 is raised or lowered by the focal point position adjustment means, the pulse laser beam LB emitted from the laser oscillator 72 in parallel to the X-axis direction is subjected to conversion of the direction of the optical path from the X-axis direction to the Y-axis direction by the first mirror 78 and is guided to the second mirror, and the pulse laser beam LB guided to the second mirror is subjected to conversion of the direction of the optical path from the Y-axis direction to the Z-axis direction by the second mirror and is guided to the light collector 74.

Moreover, in the laser irradiation means 62, the ingot held by the second holding table 60 is imaged by the alignment means 76 and the region to be subjected to laser processing is detected. Then, the light collector 74 is raised and lowered by the focal point position adjustment means and the focal point of the pulse laser beam LB with such a wavelength as to be transmitted through the ingot is positioned to a depth corresponding to the thickness of the wafer to be produced from the upper surface of the ingot held by the second holding table 60. Thereafter, the ingot held by the second holding table 60 is irradiated with the pulse laser beam LB while the light collector 74 is moved in the Y-axis direction as appropriate by the Y-axis feed means. Thereby, a separation layer at which the strength is lowered can be formed inside the ingot. When the ingot held by the second holding table 60 is irradiated with the pulse laser beam LB, the second holding table 60 may be moved in the X-axis display by the X-axis feed means.

The wafer separating unit 8 will be described with reference to FIG. 1 and FIG. 6. As depicted in FIG. 1, the wafer separating unit 8 disposed adjacent to the laser irradiation unit 6 is composed of at least a third holding table 80 that holds an ingot and has a circular shape and wafer separating means 82 that holds the upper surface of the ingot held by the third holding table 80 and separates a wafer from a separation layer.

Figure 6:
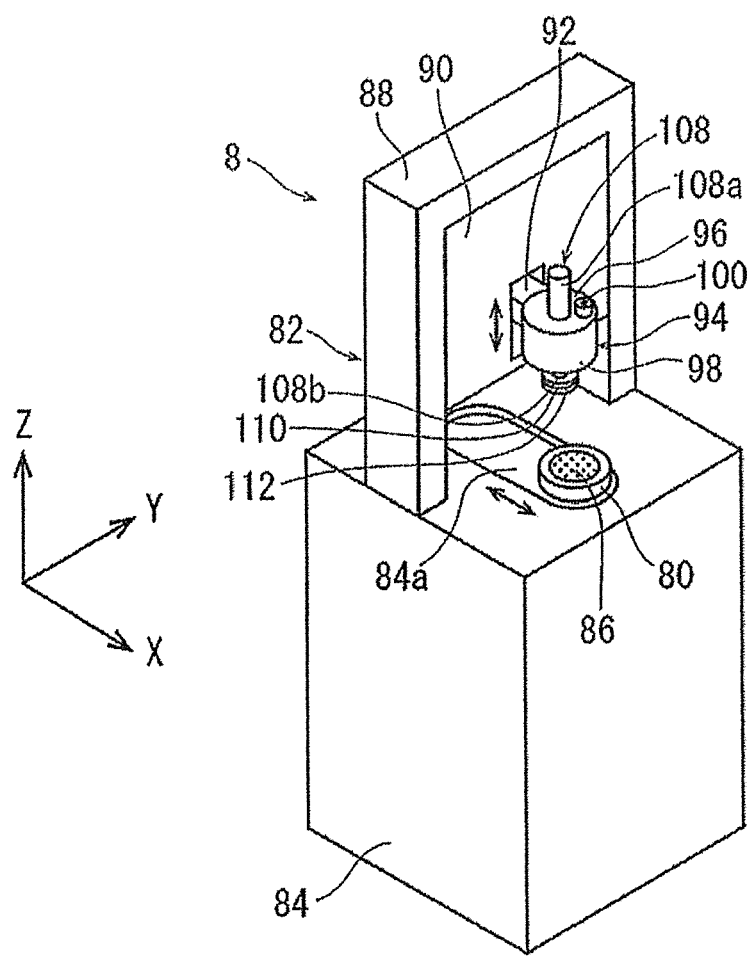
FIG. 6 is a perspective view of a wafer separating unit depicted in FIG. 1.

In the present embodiment, as depicted in FIG. 6, the wafer separating unit 8 includes a base 84 with a rectangular parallelepiped shape and a mounting recess 84a that hollows downward and extends in the X-axis direction is formed in the upper surface of this base 84. Furthermore, the third holding table 80 in the present embodiment is mounted in the mounting recess 84a of the base 84 movably in the X-axis direction. Moreover, the base 84 is equipped with X-axis feed means (not depicted) that moves the third holding table 80 in the X-axis direction along the mounting recess 84a. It suffices for the X-axis feed means to be a configuration having a ball screw that is joined to the third holding table 80 and extends in the X-axis direction and a motor that rotates this ball screw, for example. In addition, a porous suction adhesion chuck 86 connected to suction means (not depicted) is disposed on the upper surface of the third holding table 80. In the third holding table 80, an ingot placed on the upper surface of the suction adhesion chuck 86 is sucked and held by producing a suction force for the upper surface of the suction adhesion chuck 86 by the suction means.

As depicted in FIG. 6, the wafer separating means 82 of the wafer separating unit 8 includes a gate-shaped support frame 88 mounted on the upper surface of the base 84, a casing 90 supported inside the support frame 88, an arm 92 that extends in the X-axis direction from a base end part supported by the casing 90 movably up and down, and arm moving means (not depicted) that raises and lowers the arm 92. It suffices for the arm moving means to be a configuration having a ball screw that is joined to the base end part of the arm 92 and extends in the Z-axis direction and a motor that rotates this ball screw, for example.

Figure 7:
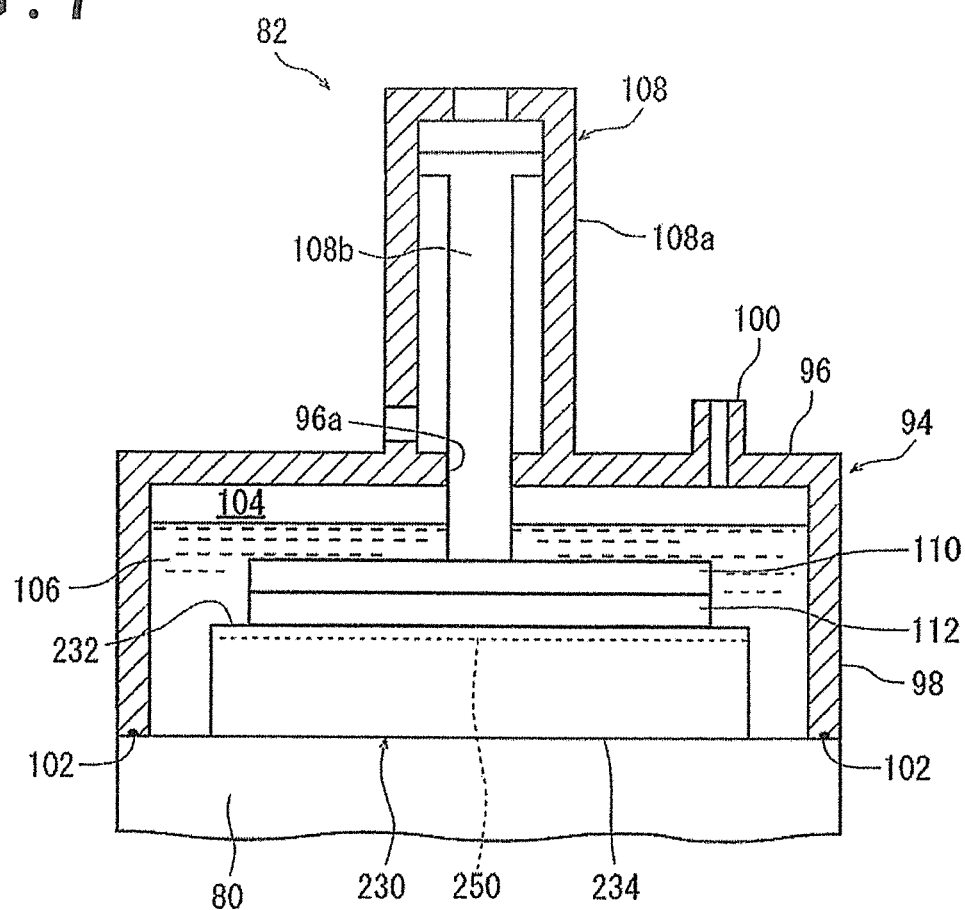
FIG. 7 is a partial sectional view of the wafer separating unit depicted in FIG. 6.

The description about the wafer separating means 82 will be continued with reference to FIG. 7 in conjunction with FIG. 6. As depicted in FIG. 6 and FIG. 7, a liquid bath 94 that houses a liquid in cooperation with the third holding table 80 when a wafer is separated from an ingot is fixed to the tip part of the arm 92. The liquid bath 94 has a circular top wall 96 and a skirt wall 98 that droops from the circumferential edge of the top wall 96 and has a circular cylindrical shape, and the lower end side thereof is opened. The outer diameter of the skirt wall 98 is set equal to or smaller than the diameter of the third holding table 80 and the lower end of the skirt wall 98 gets contact with the upper surface of the third holding table 80 when the arm 92 is lowered. A liquid supply part 100 that makes the outside and inside of the liquid bath 94 communicate with each other and has a circular cylindrical shape is annexed to the top wall 96 and the liquid supply part 100 is connected to liquid supply means (not depicted). As depicted in FIG. 7, a ring-shaped packing 102 is annexed to the lower end of the skirt wall 98. Moreover, when the arm 92 is lowered by the arm moving means to bring the lower end of the skirt wall 98 into tight contact with the upper surface of the third holding table 80, a liquid housing space 104 is defined by the upper surface of the third holding table 80 and the inner surface of the liquid bath 94. A liquid 106 supplied from the liquid supply means to the liquid housing space 104 through the liquid supply part 100 is prevented from leaking from the liquid housing space 104 by the packing 102.

As depicted in FIG. 7, an air cylinder 108 is mounted on the top wall 96 of the liquid bath 94 and a cylinder tube 108a of the air cylinder 108 extends upward from the upper surface of the top wall 96. A lower end part of a piston rod 108b of the air cylinder 108 passes through a through-opening 96a of the top wall 96 and protrudes to the lower side of the top wall 96. An ultrasonic vibration producing member 110 that can be formed from piezoelectric ceramics or the like is fixed to the lower end part of the piston rod 108b and a suction adhesion piece 112 is fixed to the lower surface of the ultrasonic vibration producing member 110. The suction adhesion piece 112 having plural suction holes (not depicted) formed in the lower surface is connected to suction means (not depicted). By producing a suction force for the lower surface of the suction adhesion piece 112 by the suction means, the suction adhesion piece 112 sucks and holds an ingot.

Furthermore, in the wafer separating means 82, the arm 92 is lowered by the arm moving means and the lower end of the skirt wall 98 is brought into tight contact with the upper surface of the third holding table 80 that holds an ingot in which a separation layer has been formed. In addition, the piston rod 108b of the air cylinder 108 is lowered and the suction adhesion piece 112 is caused to adhere to the upper surface of the ingot by suction. Thereafter, the liquid 106 is housed in the liquid housing space 104 and then the ultrasonic vibration producing member 110 is actuated to give ultrasonic vibration to the ingot. Thereby, the strength of the separation layer can be further lowered. Moreover, in the wafer separating means 82, by raising the suction adhesion piece 112 by the air cylinder 108 in the state in which the upper surface of the ingot is caused to adhere to the suction adhesion piece 112 by suction, a wafer can be separated from the ingot by use of the separation layer whose strength has been further lowered as the point of origin.

Figure 8:
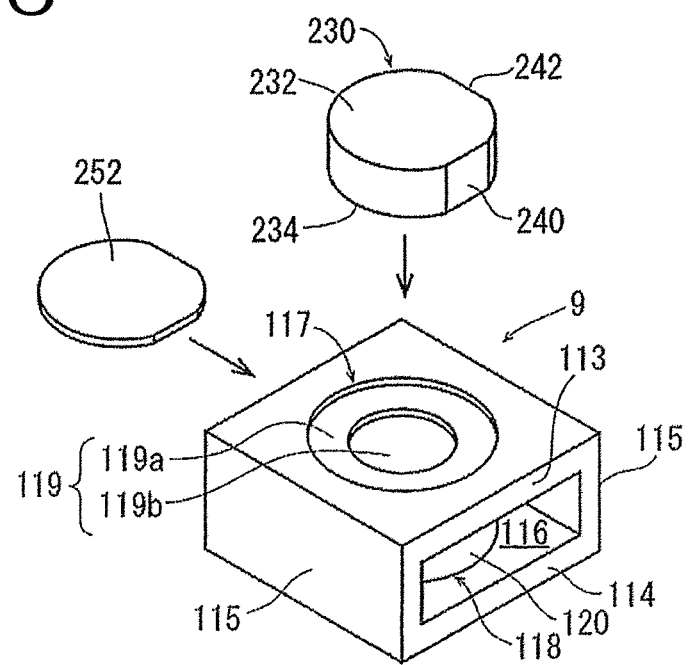
FIG. 8 is a perspective view of a tray depicted in FIG. 1.

The tray 9 will be described with reference to FIG. 8. The tray 9 of the present embodiment is composed of a rectangular upper wall 113, a rectangular lower wall 114 disposed below the upper wall 113, a pair of rectangular sidewalls 115 that couple the upper wall 113 and the lower wall 114, and a cavity 116 that penetrates between the pair of sidewalls 115. The tray 9 has an ingot support part 117 that supports an ingot in the upper surface of the upper wall 113 and has a wafer support part 118 that supports a separated wafer in the upper surface of the lower wall 114.

The ingot support part 117 of the present embodiment has a recess part 119 corresponding to ingots with two or more kinds of sizes. The recess part 119 has a ring-shaped larger-diameter recess part 119a that hollows downward from the upper surface of the upper wall 113 and a circular smaller-diameter recess part 119b that has a smaller diameter than the larger-diameter recess part 119a and further hollows downward relative to the larger-diameter recess part 119a. The larger-diameter recess part 119a and the smaller-diameter recess part 119b are concentrically formed. Furthermore, in the tray 9, an ingot with a comparatively-large diameter (for example, 6 inches of diameter) is supported by the larger-diameter recess part 119a and an ingot with a comparatively-small diameter (for example, 5 inches of diameter) is supported by the smaller-diameter recess part 119b.

Although detailed diagrammatic representation is omitted, the wafer support part 118 has a recess part 120 corresponding to wafers with two or more kinds of sizes. The configuration of the recess part 120 of the wafer support part 118 may be a configuration having a ring-shaped larger-diameter recess part that hollows downward from the upper surface of the lower wall 114 and a circular smaller-diameter recess part that has a smaller diameter than this larger-diameter recess part and further hollows downward relative to the larger-diameter recess part similarly to the configuration of the recess part 119 of the ingot support part 117. The larger-diameter recess part and the smaller-diameter recess part of the wafer support part 118 can be concentrically formed. Furthermore, in the tray 9, a wafer with a comparatively-large diameter (for example, 6 inches of diameter) is supported by the larger-diameter recess part of the wafer support part 118 and a wafer with a comparatively-small diameter (for example, 5 inches of diameter) is supported by the smaller-diameter recess part of the wafer support part 118. Contrary to the present embodiment, the tray 9 may have a configuration that has the wafer support part in the upper surface of the upper wall 113 and has the ingot support part in the upper surface of the lower wall 114.

The belt conveyor unit 10 will be described with reference to FIG. 9. The belt conveyor unit 10 disposed along the ingot grinding unit 4, the laser irradiation unit 6, and the wafer separating unit 8 is composed of at least a forward belt conveyor 121 that conveys the tray 9 in direction Y1 represented by an arrow Y1 in FIG. 9, a backward belt conveyor 122 that conveys the tray 9 in direction Y2 (opposite direction to Y1) represented by an arrow Y2 in FIG. 9, and conveying means 123 that conveys the tray 9 from the ending point of the forward belt conveyor 121 to the starting point of the backward belt conveyor 122.

The forward belt conveyor 121 includes a pair of support walls 125 that extend in the Y-axis direction with the intermediary of an internal in the X-axis direction, plural rollers 126 rotatably mounted on the inner surface of each support wall 125 at intervals in the Y-axis direction, a pair of endless belts 127 wound around the rollers 126, and a motor 128 that rotates the rollers 126. In the present embodiment, three forward belt conveyors 121 are disposed along the Y-axis direction. However, the length of the conveyance path of the tray 9 can be changed by changing the quantity of forward belt conveyors 121 and the length of the support walls 125 in the Y-axis direction as appropriate. Furthermore, in the forward belt conveyor 121, the tray 9 mounted on the endless belts 127 is conveyed in direction Y1 by rotating the endless belts 127 by the motor 128 through the rollers 126.

Figure 9:
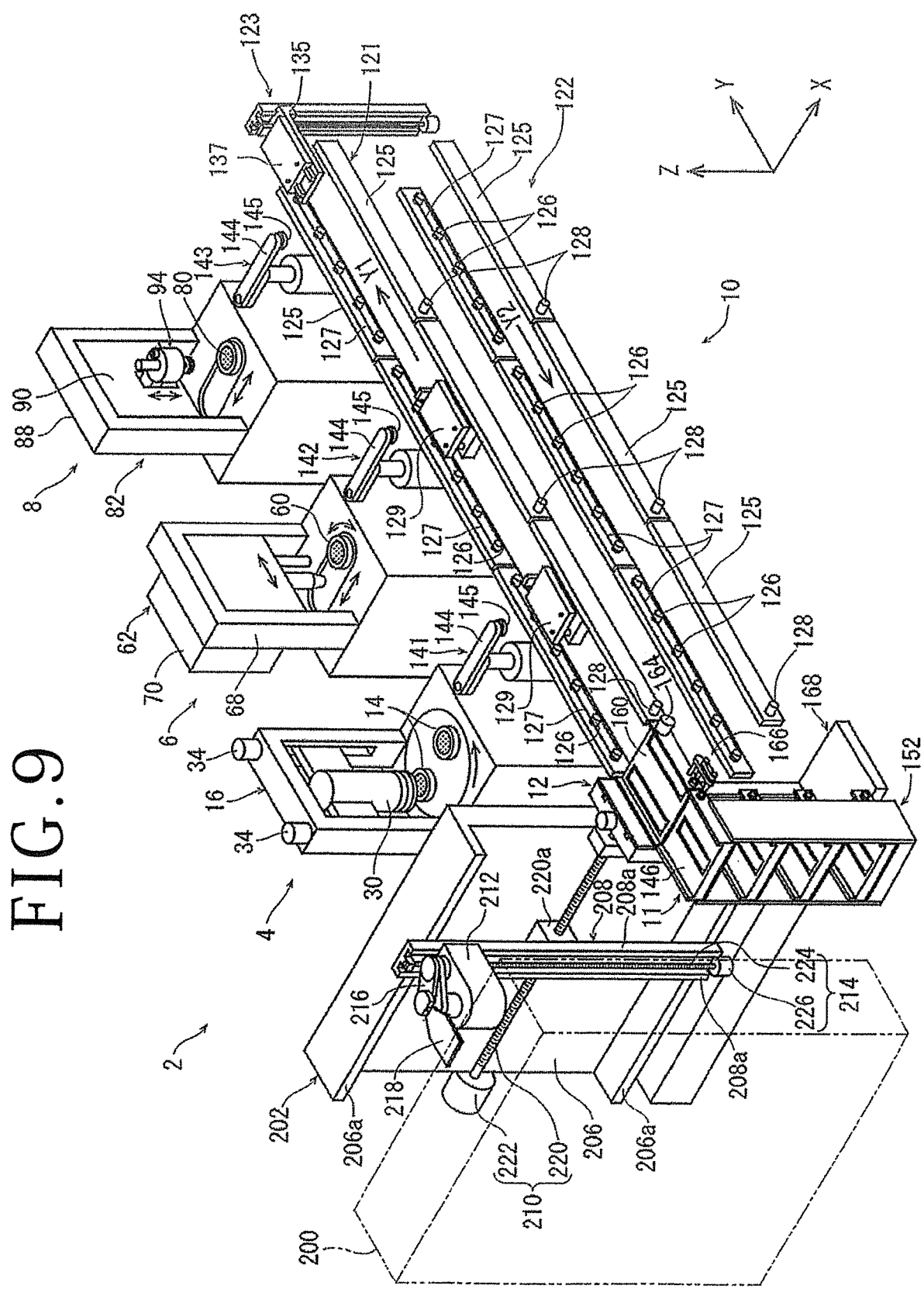
FIG. 9 is a partial perspective view of the wafer producing apparatus depicted in FIG. 1.

In the present embodiment, as depicted in FIG. 9, the configuration of the backward belt conveyor 122 disposed below the forward belt conveyor 121 may be substantially the same as the configuration of the forward belt conveyor 121. Thus, the configuration of the backward belt conveyor 122 is given the same numerals as the configuration of the forward belt conveyor 121. Furthermore, in the backward belt conveyor 122, the tray 9 mounted on the endless belts 127 is conveyed in direction Y2 by rotating the endless belts 127 by the motor 128 through the rollers 126 in the opposite direction to the forward belt conveyor 121. The backward belt conveyor 122 may be disposed above the forward belt conveyor 121. Furthermore, it is preferable that both the forward belt conveyor 121 and the backward belt conveyor 122 be always running when the wafer producing apparatus 2 is running.

As depicted in FIG. 9, a tray stopper 129 that stops the tray 9 that is being conveyed by the forward belt conveyor 121 is disposed at each of a position opposed to the ingot grinding unit 4 and a position opposed to the laser irradiation unit 6 in the forward belt conveyor 121. In the present embodiment, as depicted in FIG. 10, the tray stopper 129 includes a substrate 130 fixed by an appropriate bracket (not depicted), a rising-lowering plate 131 supported by the upper surface of the substrate 130 movably up and down, cylinder means 132 that raise and lower the rising-lowering plate 131, and a stopper piece 133 fixed to the end part of the rising-lowering plate 131 on the downstream side in direction Y1.

As depicted in FIG. 10A to FIG. 10C, on the upper surface of the rising-lowering plate 131, a pair of engagement protrusions 131a that engage with a pair of engaged recesses (not depicted) formed in the lower surface of the lower wall 114 of the tray 9 are formed. As depicted in FIG. 10A to FIG. 11C, the cylinder means 132 that are air-driven or electrically driven position the rising-lowering plate 131 to the following positions: a passing position (for example, position depicted in FIG. 10A and FIG. 11A) with which the upper end of the stopper piece 133 is located on the lower side relative to the lower end of the tray 9 that is being conveyed by the forward belt conveyor 121; a stop position (for example, position depicted in FIG. 10B and FIG. 11B) with which the stopper piece 133 gets contact with the tray 9 that is being conveyed by the forward belt conveyor 121; and a separation position (for example, position depicted in FIG. 10C and FIG. 11C) with which the tray 9 is separated from the endless belts 127.

Furthermore, in the tray stopper 129, the passing of the tray 9 above the tray stopper 129 is permitted by positioning the rising-lowering plate 131 to the passing position (see FIG. 11A), and the tray 9 that is being conveyed by the forward belt conveyor 121 can be stopped by positioning the rising-lowering plate 131 to the stop position on the upper side relative to the passing position (see FIG. 11B). Moreover, in the tray stopper 129, by positioning the rising-lowering plate 131 to the separation position on the upper side relative to the stop position, the load on the motor 128 of the forward belt conveyor 121 is prevented from increasing due to sliding between the lower surface of the stopped tray 9 and the upper surfaces of the endless belts 127 (see FIG. 11C). In addition, position displacement of the tray 9 at the rising-lowering plate 131 is prevented when the engagement protrusions 131a of the rising-lowering plate 131 engage with the engaged recesses of the tray 9 at the stop position or the separation position.

Figure 12A:
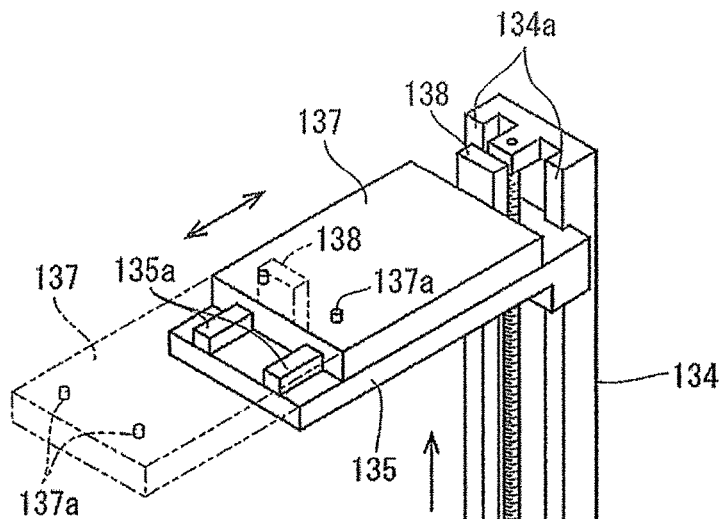
FIG. 12A is a perspective view of conveying means in the state in which a rising-lowering plate is located at a rising position.
Figure 12B:
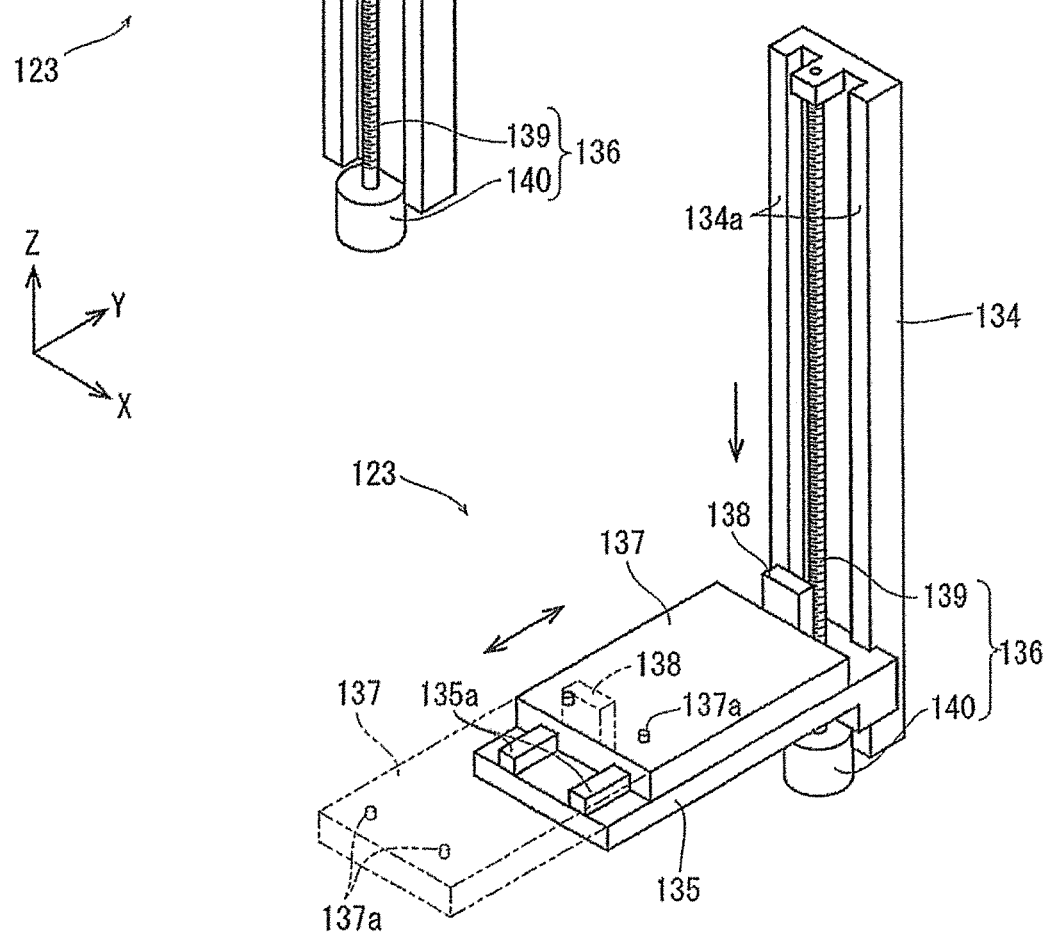
FIG. 12B is a perspective view of the conveying means in the state in which the rising-lowering plate is located at a lowering position.

The conveying means 123 will be described with reference to FIG. 9, FIG. 12A, and FIG. 12B. The conveying means 123 disposed adjacent to the ending point of the forward belt conveyor 121 and the starting point of the backward belt conveyor 122 includes a support wall 134 that extends in the Z-axis direction, a rising-lowering plate 135 supported by the support wall 134 movably up and down, raising-lowering means 136 that raises and lowers the rising-lowering plate 135, a Y-axis movable plate 137 supported by the upper surface of the rising-lowering plate 135 movably in the Y-axis direction, Y-axis feed means (not depicted) that moves the Y-axis movable plate 137 in the Y-axis direction, and a stopper piece 138 fixed to the end part of the Y-axis movable plate 137 on the downstream side in direction Y1.

The raising-lowering means 136 has a ball screw 139 that is joined to the rising-lowering plate 135 and extends in the Z-axis direction and a motor 140 that rotates the ball screw 139. The raising-lowering means 136 raises and lowers the rising-lowering plate 135 in the Z-axis direction along guide rails 134a of the support wall 134 and stops the rising-lowering plate 135 at an arbitrary position between a rising position depicted in FIG. 12A and a lowering position depicted in FIG. 12B. On the upper surface of the Y-axis movable plate 137, a pair of engagement protrusions 137a that engage with the above-described pair of engaged recesses of the tray 9 are formed. The Y-axis feed means is formed of an air cylinder or electric cylinder, for example, and moves the Y-axis movable plate 137 in the Y-axis direction along guide rails 135a of the rising-lowering plate 135 between an advancing position depicted by two-dot chain lines in FIG. 12A and FIG. 12B and a retreating position depicted by solid lines in FIG. 12A and FIG. 12B.

Furthermore, in the conveying means 123, by positioning the upper surface of the Y-axis movable plate 137 to the slightly lower side relative to the upper surfaces of the endless belts 127 of the forward belt conveyor 121 and positioning the Y-axis movable plate 137 to the advancing position, the stopper piece 138 can be brought into contact with the tray 9 that is being conveyed by the forward belt conveyor 121 and the tray 9 can be stopped at the ending point of the forward belt conveyor 121 (in the present embodiment, also the position opposed to the wafer separating unit 8). Moreover, by raising the rising-lowering plate 135 in the state in which the tray 9 is stopped, the lower surface of the tray 9 can be separated from the upper surfaces of the endless belts 127 and the tray 9 can be mounted on the upper surface of the Y-axis movable plate 137. When the tray 9 is mounted on the Y-axis movable plate 137, the engagement protrusions 137a of the Y-axis movable plate 137 engage with the engaged recesses of the tray 9 and position displacement of the tray 9 at the Y-axis movable plate 137 is prevented. Moreover, the Y-axis movable plate 137 on which the tray 9 is mounted is positioned to the retreating position and subsequently the rising-lowering plate 135 is lowered until the upper surface of the Y-axis movable plate 137 is located on the slightly upper side relative to the upper surfaces of the endless belts 127 of the backward belt conveyor 122. Subsequently, the Y-axis movable plate 137 is positioned to the advancing position and then the rising-lowering plate 135 is slightly lowered. Thereby, the tray 9 can be transferred from the Y-axis movable plate 137 to the endless belts 127 of the backward belt conveyor 122. In this manner, the conveying means 123 conveys the tray 9 from the ending point of the forward belt conveyor 121 to the starting point of the backward belt conveyor 122.

In the present embodiment, as depicted in FIG. 9, the belt conveyor unit 10 further includes first transfer means 141 that transfers an ingot between the tray 9 stopped by the tray stopper 129 on the starting point side of the forward belt conveyor 121 and the ingot grinding unit 4, second transfer means 142 that transfers an ingot between the tray 9 stopped by the tray stopper 129 on the ending point side of the forward belt conveyor 121 and the laser irradiation unit 6, and third transfer means 143 that transfers an ingot between the tray 9 stopped by the conveying means 123 and the wafer separating unit 8 and transfers a wafer separated from an ingot from the wafer separating unit 8 to the tray 9.

The configuration of the second transfer means 142 and the configuration of the third transfer means 143 may be the same as the configuration of the first transfer means 141. Therefore, the configuration of the first transfer means 141 will be described below and description about the configuration of the second transfer means 142 and the configuration of the third transfer means 143 is omitted. The first transfer means 141 includes a multi-joint arm 144, a drive source (not depicted) that drives the multi-joint arm 144, and a suction adhesion piece 145 mounted at the tip of the multi-joint arm 144. The drive source formed of an air drive source or electric drive source drives the multi-joint arm 144 to position the suction adhesion piece 145 to an arbitrary position in each direction of the X-axis direction, the Y-axis direction, and the Z-axis direction and turn the suction adhesion piece 145 upside down. The suction adhesion piece 145 having plural suction holes (not depicted) formed in a single surface is connected to suction means (not depicted). In the first transfer means 141, an ingot is sucked and held by the suction adhesion piece 145 by producing a suction force for the suction adhesion piece 145 by the suction means. Furthermore, in the first transfer means 141, the ingot caused to adhere to the suction adhesion piece 145 by suction is transferred between the tray 9 stopped by the tray stopper 129 and the ingot grinding unit 4 by driving the multi-joint arm 144 by the drive source.

The ingot stocker 11 will be described with reference to FIG. 13. The ingot stocker 11 of the present embodiment is composed of at least placement tables 146 on which the tray 9 that supports an ingot is placed, first endless belts 148 that are disposed in the placement tables 146 and send out the tray 9 that supports an ingot, driving force transmitting parts 150 that are joined to the first endless belts 148 and transmit a driving force, and a rack 152 in which plural placement tables 146 are disposed vertically.

Figure 13:
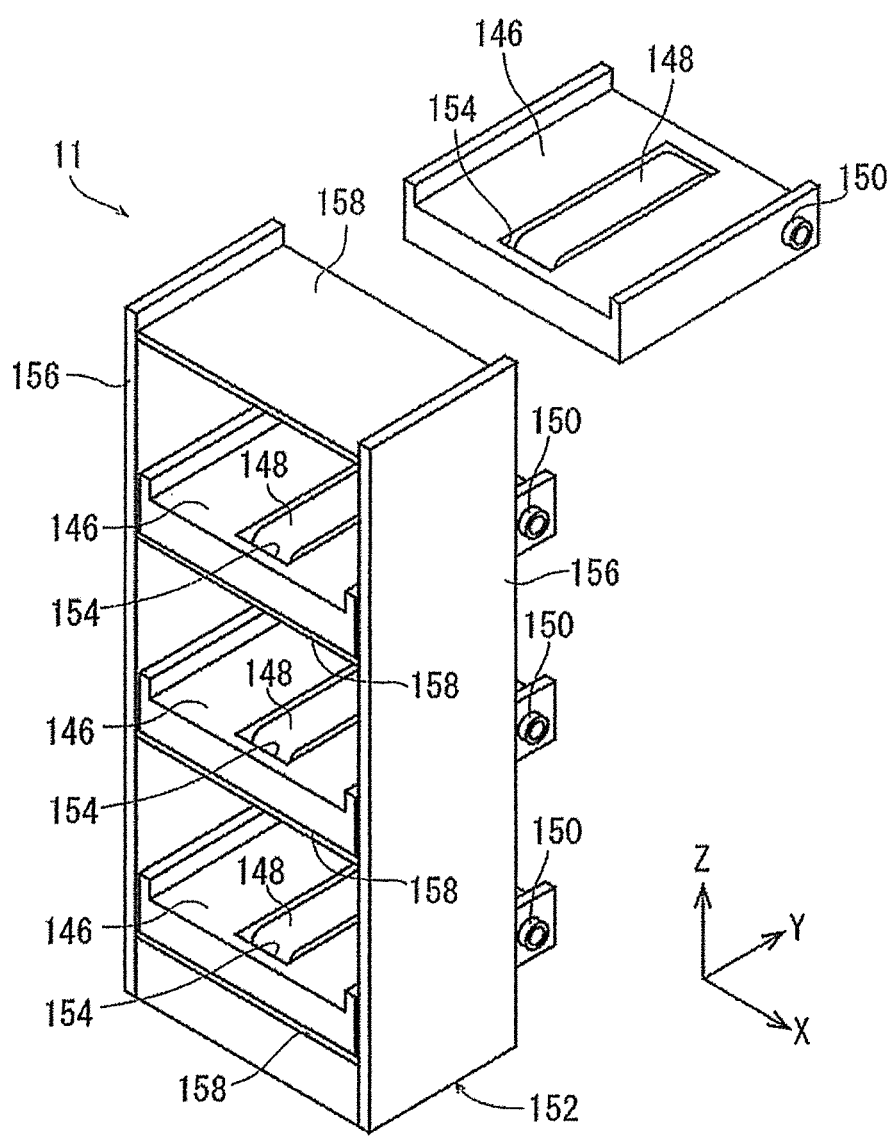
FIG. 13 is a perspective view of an ingot stocker depicted in FIG. 1.

As depicted in FIG. 13, a rectangular opening 154 that extends in the Y-axis direction is formed in the upper surface of the placement table 146 with a rectangular shape and plural rollers (not depicted) are rotatably mounted to the placement table 146. The first endless belt 148 is wound around the plural rollers of the placement table 146 and the upper surface of the first endless belt 148 is exposed from the rectangular opening 154. Furthermore, the driving force transmitting part 150 that extends in the X-axis direction and has a circular cylindrical shape is rotatably mounted to the placement table 146. One end part of the driving force transmitting part 150 protrudes from a side surface on one end side of the placement table 146 in the Y-axis direction and the other end part of the driving force transmitting part 150 is joined to the roller around which the first endless belt 148 is wound. The rack 152 of the present embodiment includes a pair of side plates 156 disposed at an interval in the X-axis direction and four shelf boards 158 disposed at intervals in the upward-downward direction between the side plates 156, and the placement table 146 is disposed on each shelf board 158. Furthermore, in the ingot stocker 11, when the driving force transmitting part 150 is rotated, the first endless belt 148 rotates and the tray 9 placed on the upper surface of the placement table 146 is sent out in the Y-axis direction by the first endless belt 148. The roller of the placement table 146 may be formed of a circular cylindrical member and double as the driving force transmitting part 150.

The ingot delivery unit 12 will be described with reference to FIG. 1 and FIG. 14. As depicted in FIG. 1, the ingot delivery unit 12 is disposed between the belt conveyor unit 10 and the ingot stocker 11. Furthermore, as depicted in FIG. 14, the ingot delivery unit 12 of the present embodiment is composed of at least a receiving table 160 that receives the tray 9 that supports an ingot from the placement table 146, a second endless belt 162 that delivers the tray 9 that is disposed on the receiving table 160 and supports an ingot to the belt conveyor unit 10, a motor 164 that drives the second endless belt 162, a clutch part 166 that is joined to the second endless belt 162 and transmits a driving force to the driving force transmitting part 150 of the ingot stocker 11, and an elevator 168 that positions the receiving table 160 to any of the plural placement tables 146 disposed vertically.

Figure 14:
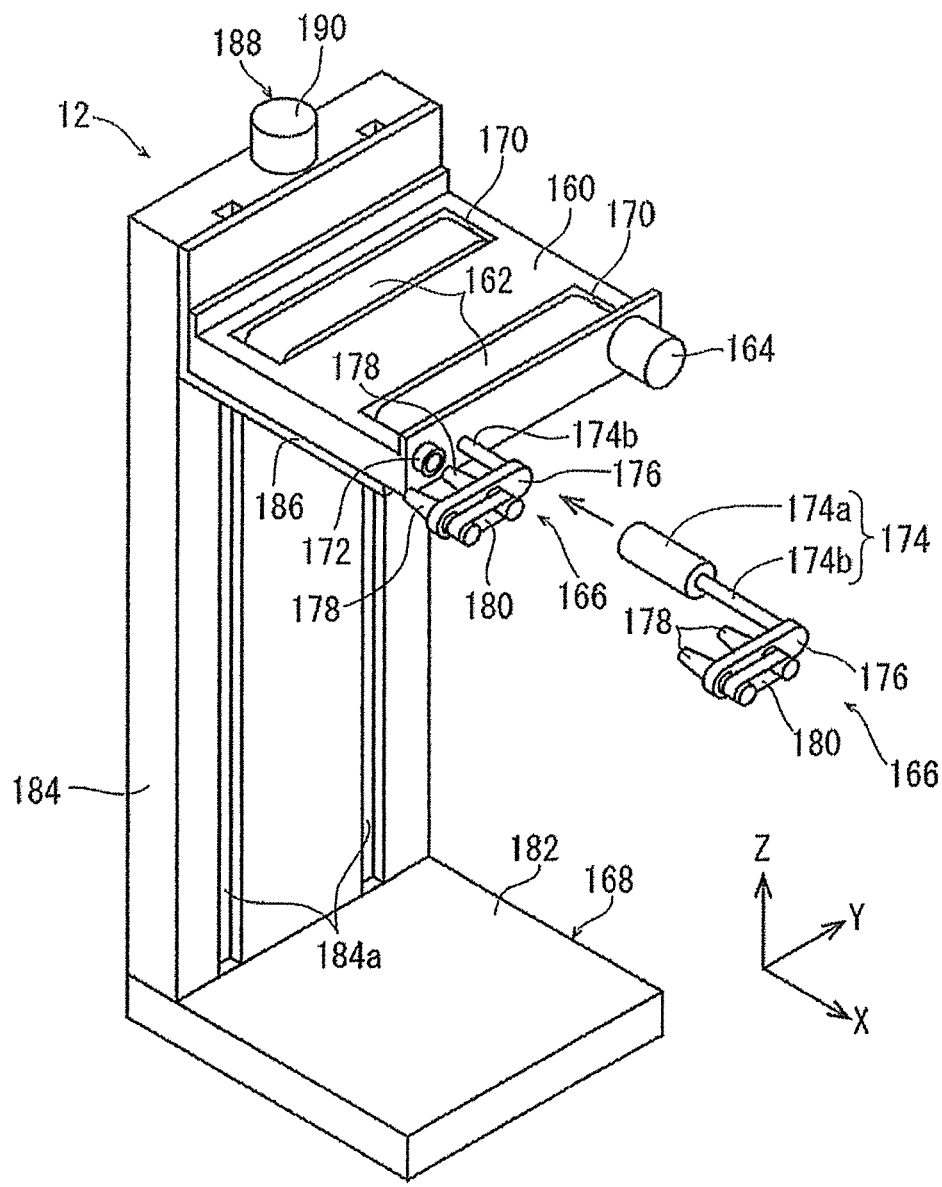
FIG. 14 is a perspective view of an ingot delivery unit depicted in FIG. 1.

As depicted in FIG. 14, a pair of rectangular openings 170 that extend in the Y-axis direction with the intermediary of an interval in the X-axis direction are formed in the upper surface of the receiving table 160 with a rectangular shape and plural rollers (not depicted) are rotatably mounted to the receiving table 160. The second endless belts 162 are wound around the plural rollers of the receiving table 160 and the upper surfaces of the second endless belts 162 are exposed from the rectangular openings 170. Furthermore, a driving force transmitting part 172 that extends in the X-axis direction and has a circular cylindrical shape is rotatably mounted on one end side of the receiving table 160 in the Y-axis direction. One end part of the driving force transmitting part 172 protrudes from a side surface of the receiving table 160 and the other end part of the driving force transmitting part 172 is joined to the roller around which the second endless belt 162 is wound. The motor 164 is mounted on the side surface of the receiving table 160 on the other end side in the Y-axis direction and a rotating shaft (not depicted) of the motor 164 is joined to the roller around which the second endless belt 162 is wound. The roller of the receiving table 160 may be formed of a circular cylindrical member and double as the driving force transmitting part 172.

The description with reference to FIG. 14 will be continued. The clutch part 166 has an air cylinder 174 having a cylinder tube 174a fixed to the receiving table 160 and a piston rod 174b mounted on the cylinder tube 174a movably forward and backward in the X-axis direction, a bracket piece 176 fixed to the tip of the piston rod 174b of the air cylinder 174, a pair of taper pins 178 rotatably mounted on the bracket piece 176 at an interval in the Y-axis direction, and an endless transmission belt 180 wound around the pair of taper pins 178. Furthermore, the elevator 168 includes a substrate 182, a support plate 184 that extends in the Z-axis direction from one end part of the substrate 182 in the X-axis direction, a rising-lowering plate 186 supported by the support plate 184 movably up and down, and raising-lowering means 188 that raises and lowers the rising-lowering plate 186. The receiving table 160 is disposed on the upper surface of the rising-lowering plate 186. The raising-lowering means 188 has a ball screw (not depicted) that is joined to the rising-lowering plate 186 and extends in the Z-axis direction and a motor 190 that rotates this ball screw. The raising-lowering means 188 raises and lowers the rising-lowering plate 186 in the Z-axis direction along guide rails 184a of the support plate 184 and stops the rising-lowering plate 186 at an arbitrary position.

Figure 15:
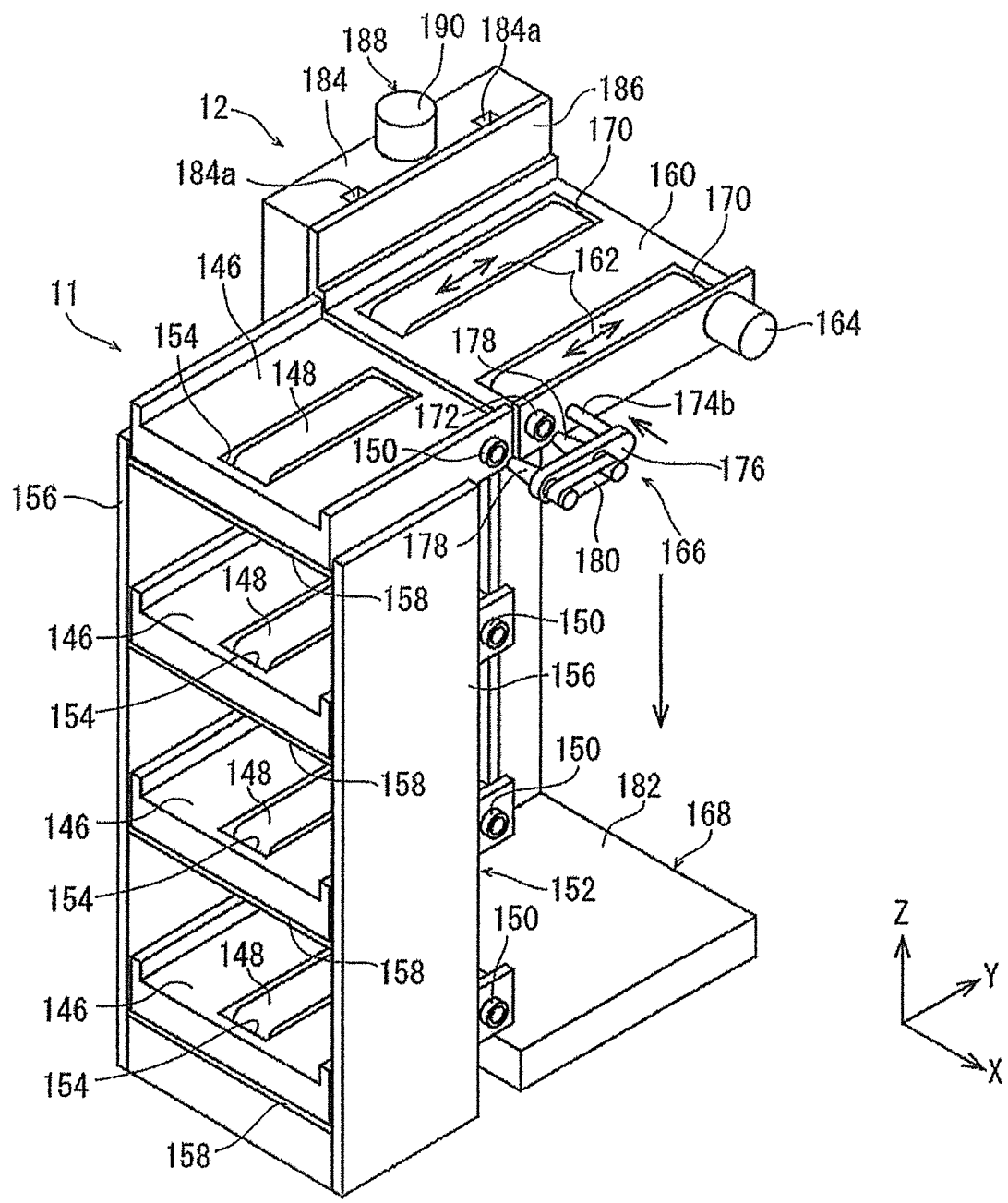
FIG. 15 is a perspective view of the state in which the ingot stocker depicted in FIG. 13 and the ingot delivery unit depicted in FIG. 14 are combined.

Referring to FIG. 15, in the ingot delivery unit 12, the rising-lowering plate 186 of the elevator 168 is raised and lowered and the rising-lowering plate 186 is stopped at a position with which the upper surface of the arbitrary placement table 146 of the ingot stocker 11 and the upper surface of the receiving table 160 are located at the same height. Thereafter, the piston rod 174b of the air cylinder 174 of the clutch part 166 is moved from an expanding position depicted in FIG. 15 to a contracting position. Due to this, one of the pair of taper pins 178 of the clutch part 166 is inserted into the driving force transmitting part 150 of the ingot stocker 11 and is joined in such a manner as to be capable of transmitting rotation. In addition, the other of the pair of taper pins 178 is inserted into the driving force transmitting part 172 of the ingot delivery unit 12 and is joined in such a manner as to be capable of transmitting rotation. When the motor 164 rotates in this state, the second endless belts 162 rotate. In addition, the first endless belt 148 of the ingot stocker 11 rotates through rotation of the driving force transmitting part 172, the pair of taper pins 178, and the transmission belt 180 of the ingot delivery unit 12 and the driving force transmitting part 150 of the ingot stocker 11. Thereby, the tray 9 placed on the upper surface of the placement table 146 of the ingot stocker 11 is sent out in the Y-axis direction by the first endless belt 148 and is delivered to the receiving table 160 of the ingot delivery unit 12.

Furthermore, after receiving the tray 9 by the receiving table 160, the ingot delivery unit 12 stops the rotation of the motor 164 and moves the piston rod 174b of the air cylinder 174 of the clutch part 166 from the contracting position to the expanding position. This releases the joining between the one of the pair of taper pins 178 and the driving force transmitting part 150 of the ingot stocker 11 and releases the joining between the other of the pair of taper pins 178 and the driving force transmitting part 172 of the ingot delivery unit 12. Then, the ingot delivery unit 12 sets the upper surface of the receiving table 160 on which the tray 9 is placed to the same height as the upper surfaces of the endless belts 127 of the forward belt conveyor 121 of the belt conveyor unit 10 by raising and lowering the rising-lowering plate 186 by the elevator 168 as appropriate, and then rotates the motor 164. Thereby, the second endless belts 162 rotate and the tray 9 placed on the upper surface of the receiving table 160 is delivered to the forward belt conveyor 121 of the belt conveyor unit 10. In this manner, the ingot delivery unit 12 delivers the ingot supported by the tray 9 housed in the ingot stocker 11 to the belt conveyor unit 10.

Figure 16:
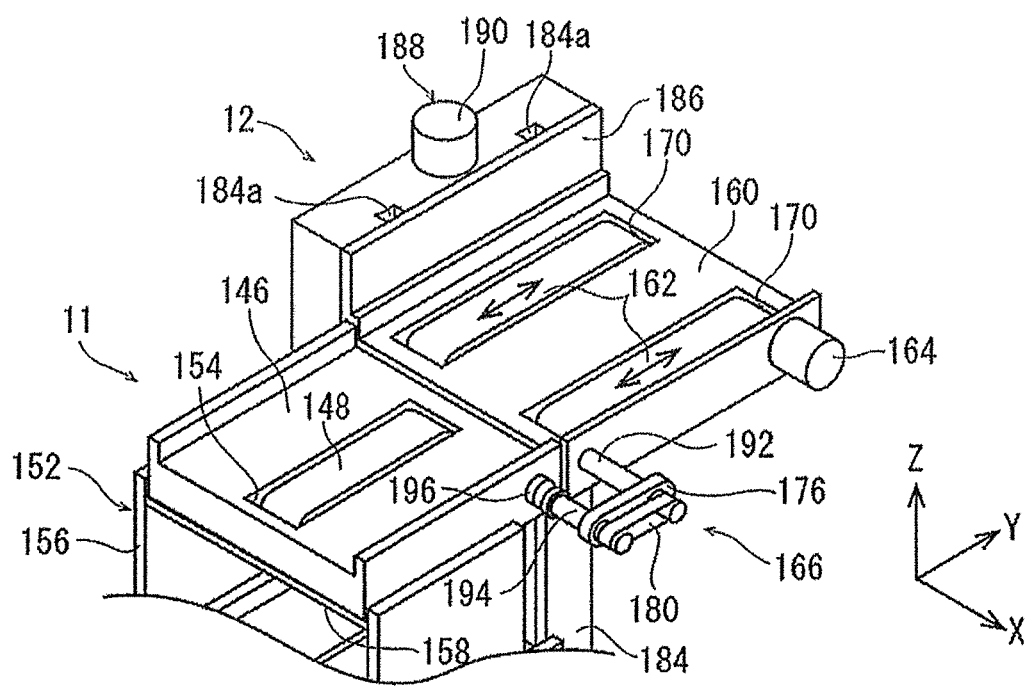
FIG. 16 is a perspective view depicting a modification example of a clutch part.

The driving force transmitting part 150 of the ingot stocker 11 and the driving force transmitting part 172 and the clutch part 166 of the ingot delivery unit 12 are not limited to the above-described embodiment and may be another embodiment like one depicted in FIG. 16, for example. In the other embodiment depicted in FIG. 16, instead of the pair of taper pins 178 of the above-described clutch part 166, a rotating shaft 192 joined to the roller of the receiving table 160 and a drive magnet member 194 are rotatably mounted on a bracket piece 176. Furthermore, a driven magnet member 196 as a driving force transmitting part is mounted on the roller of the placement table 146.

Moreover, in the other embodiment depicted in FIG. 16, after the rising-lowering plate 186 is moved to a position with which the upper surface of the arbitrary placement table 146 of the ingot stocker 11 and the upper surface of the receiving table 160 are located at the same height, rotation of the motor 164 is transmitted to the first endless belt 148 of the placement table 146 through magnet coupling formed from the drive magnet member 194 and the driven magnet member 196. Because the above-described magnet coupling may be contactless (gap can be made between the drive magnet member 194 and the driven magnet member 196), the air cylinder 174 for moving the bracket piece 176 in the X-axis direction is unnecessary in the other embodiment depicted in FIG. 16.

Referring to FIG. 1 and FIG. 9, the wafer producing apparatus 2 of the present embodiment further includes a cassette stocker 200 in which plural cassettes 198 that house separated wafers are housed and housing means 202 that causes a wafer supported by the wafer support part 118 of the tray 9 to be housed in the cassette 198 housed in the cassette stocker 200.

As depicted in FIG. 1, the cassette stocker 200 has 16 cassette housing parts 204 in total on four columns in the X-axis direction and four stages in the Z-axis direction. In each cassette housing part 204, the cassette 198 that houses wafers separated from an ingot in the wafer separating unit 8 is housed. The cassette 198 can house plural (for example, 25) wafers with the intermediary of intervals in the upward-downward direction. Furthermore, in the cassette stocker 200, each cassette housing part 204 penetrates in the Y-axis direction. The cassette 198 can be housed in each cassette housing part 204 from the near side in the Y-axis direction in FIG. 1 and a wafer can be housed in the cassette 198 in the cassette housing part 204 from the far side in the Y-axis direction in FIG. 1.

As depicted in FIG. 9, the housing means 202 is disposed adjacent to the ingot delivery unit 12 and the cassette stocker 200. The housing means 202 includes a support wall 206, an X-axis movable member 208 supported by the support wall 206 movably in the X-axis direction, X-axis feed means 210 that moves the X-axis movable member 208 in the X-axis direction, a rising-lowering block 212 supported by the X-axis movable member 208 movably up and down, raising-lowering means 214 that raises and lowers the rising-lowering block 212, a multi-joint arm 216 supported by the rising-lowering block 212, a holding piece 218 mounted on the tip of the multi-joint arm 216 in such a manner as to be capable of being turned upside down, and a drive source (not depicted) that drives the multi-joint arm 216.

The description with reference to FIG. 9 will be continued. The X-axis feed means 210 supported by the support wall 206 has a ball screw 220 that has a nut part 220a fixed to the X-axis movable member 208 and extends in the X-axis direction and a motor 222 that rotates the ball screw 220, and moves the X-axis movable member 208 in the X-axis direction along a guide rail 206a of the support wall 206. The raising-lowering means 214 supported by the X-axis movable member 208 has a ball screw 224 that is joined to the rising-lowering block 212 and extends in the Z-axis direction and a motor 226 that rotates the ball screw 224, and raises and lowers the rising-lowering block 212 along guide rails 208a of the X-axis movable member 208. The drive source formed of an air drive source or electric drive source drives the multi-joint arm 216 to position the holding piece 218 to an arbitrary position in each direction of the X-axis direction, the Y-axis direction, and the Z-axis direction and turn the holding piece 218 upside down. The holding piece 218 having plural suction holes (not depicted) formed in a single surface is connected to suction means (not depicted).

Furthermore, in the housing means 202, by orienting the suction holes of the holding piece 218 downward and producing a suction force for the holding piece 218 by the suction means, a wafer supported by the wafer support part 118 of the tray 9 can be sucked and held by the holding piece 218 and the wafer held by the holding piece 218 can be housed in the cassette 198 housed in the cassette stocker 200.

Figure 17A:
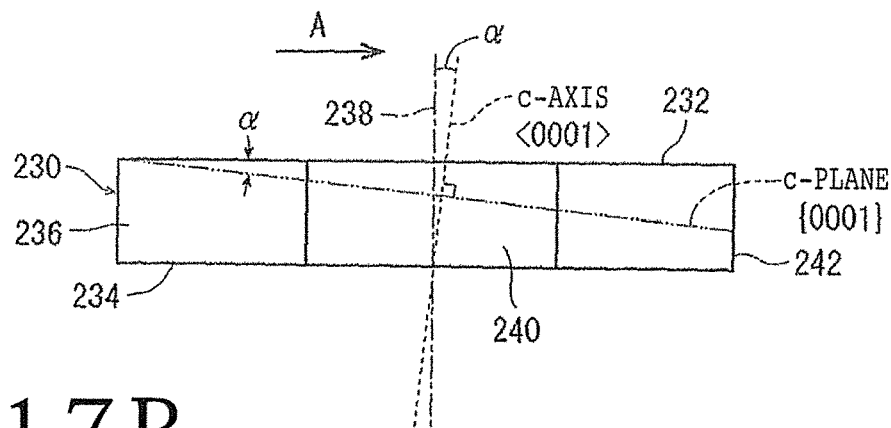
FIG. 17A is a front view of a hexagonal single-crystal SiC ingot.
Figure 17B:
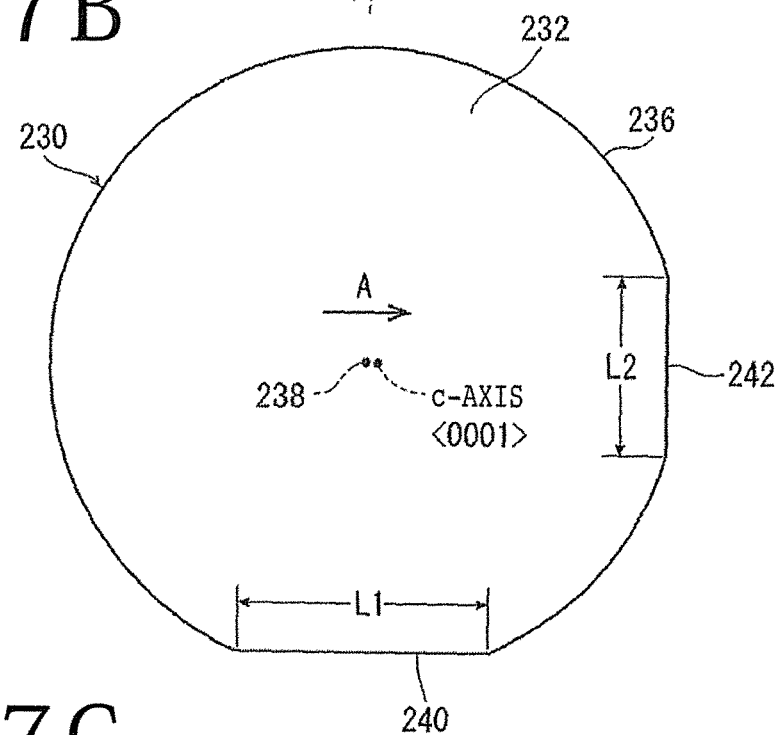
FIG. 17B is a plan view of the hexagonal single-crystal SiC ingot.
Figure 17C:
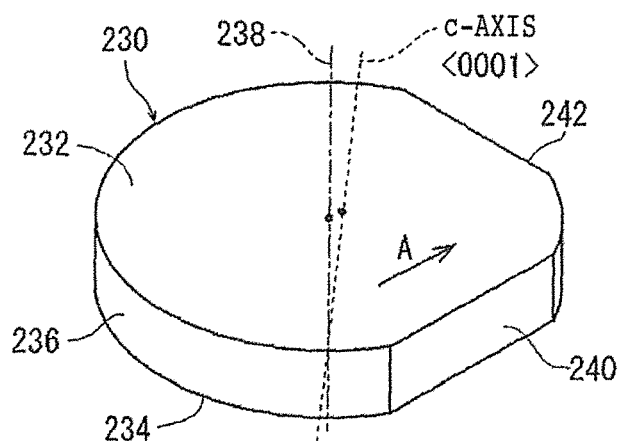
FIG. 17C is a perspective view of the hexagonal single-crystal SiC ingot.

In FIG. 17A to FIG. 17C, an ingot 230 for which processing can be executed by the wafer producing apparatus 2 is depicted. The ingot 230 is formed into a circular column shape as a whole from hexagonal single-crystal SiC and has a first surface 232 with a circular shape, a second surface 234 with a circular shape on the opposite side to the first surface 232, a circumferential surface 236 located between the first surface 232 and the second surface 234, the c-axis (<0001> direction) that reaches the second surface 234 from the first surface 232, and the c-plane ({0001} plane) orthogonal to the c-axis.

In the ingot 230, the c-axis is inclined with respect to a perpendicular 238 to the first surface 232 and an off-angle α (for example, α=1, 3, or 6 degrees) is formed by the c-plane and the first surface 232. The direction in which the off-angle α is formed is depicted by arrow A in FIG. 17A to FIG. 17C. Furthermore, in the circumferential surface 236 of the ingot 230, a first orientation flat 240 and a second orientation flat 242 that depict the crystal orientation and have a rectangular shape are formed. The first orientation flat 240 is parallel to direction A in which the off-angle α is formed and the second orientation flat 240 is orthogonal to direction A in which the off-angle α is formed. As depicted in FIG. 17B, as viewed from above, a length L2 of the second orientation flat 242 is shorter than a length L1 of the first orientation flat 240 (L2<L1).

The ingot for which the processing can be executed by the wafer producing apparatus 2 is not limited to above-described ingot 230 and, for example, may be a hexagonal single-crystal SiC ingot in which the c-axis is not inclined with respect to the perpendicular to the first surface and the off-angle between the c-plane and the first surface is 0 degrees (that is, the perpendicular to the first surface corresponds with the c-axis) or may be an ingot formed of a material other than the single-crystal SiC, such as gallium nitride (GaN).

When a wafer is produced from the ingot 230 by the above-described wafer producing apparatus 2, first, an ingot housing step of causing the ingot 230 to be housed in the ingot stocker 11 is executed. In the ingot housing step of the present embodiment, first, four ingots 230 are prepared and the ingot support parts 117 of four trays 9 are caused to support the four ingots 230 as depicted in FIG. 1. Subsequently, the respective trays 9 that support the ingots 230 are placed on the respective placement tables 146 of the ingot stocker 11 to be housed.

After the ingot housing step is executed, a first conveyance step of conveying the ingot 230 from the ingot stocker 11 to the laser irradiation unit 6 is executed by the ingot delivery unit 12 and the belt conveyor unit 10. In the ingot 230, normally the end surfaces (first surface 232 and second surface 234) are planarized to such an extent as not to hinder the incidence of a laser beam in a separation layer forming step to be described later. Therefore, in the present embodiment, an example in which the ingot 230 is conveyed from the ingot stocker 11 to the laser irradiation unit 6 in the first conveyance step will be described. However, if the end surfaces of the ingot 230 have not been planarized to such an extent as not to hinder the incidence of the laser beam in the separation layer forming step, the ingot 230 may be conveyed from the ingot stocker 11 to the ingot grinding unit 4 in the first conveyance step.

In the first conveyance step, first, the rising-lowering plate 186 of the elevator 168 of the ingot delivery unit 12 is raised or lowered and the rising-lowering plate 186 is positioned to the position with which the upper surface of the placement table 146 at an arbitrary position (for example, uppermost stage) of the ingot stocker 11 and the upper surface of the receiving table 160 are located at the same height. Subsequently, the air cylinder 174 of the clutch part 166 is actuated to insert one of the pair of taper pins 178 of the clutch part 166 into the driving force transmitting part 150 of the ingot stocker 11 and insert the other of the pair of taper pins 178 into the driving force transmitting part 172 of the ingot delivery unit 12. Subsequently, the motor 164 of the ingot delivery unit 12 is rotated to rotate the first endless belt 148 together with the second endless belts 162. Thereby, the tray 9 placed on the placement table 146 is sent out in the Y-axis direction by the first endless belt 148 and is delivered to the receiving table 160 of the ingot delivery unit 12.

After the tray 9 is delivered to the receiving table 160, the rotation of the motor 164 is stopped. Furthermore, the piston rod 174b of the air cylinder 174 is moved from the contracting position to the expanding position. Thereby, the joining between the one of the pair of taper pins 178 and the driving force transmitting part 150 of the ingot stocker 11 is released and the joining between the other of the pair of taper pins 178 and the driving force transmitting part 172 of the ingot delivery unit 12 is released. Subsequently, by moving the rising-lowering plate 186 of the elevator 168, the upper surface of the receiving table 160 on which the tray 9 is placed is set to the same height as the upper surfaces of the endless belts 127 of the forward belt conveyor 121 of the belt conveyor unit 10. Subsequently, the second endless belts 162 are rotated by rotating the motor 164 and the tray 9 placed on the upper surface of the receiving table 160 is delivered to the forward belt conveyor 121.

After the tray 9 is delivered to the forward belt conveyor 121, the tray 9 is conveyed to the position opposed to the laser irradiation unit 6 by the forward belt conveyor 121. At this time, the rising-lowering plate 131 of the tray stopper 129 disposed at the position opposed to the ingot grinding unit 4 is positioned to the passing position and the rising-lowering plate 131 of the tray stopper 129 disposed at the position opposed to the laser irradiation unit 6 is positioned to the stop position. Due to this, the tray 9 that is being conveyed in direction Y1 by the forward belt conveyor 121 can be caused to pass above the tray stopper 129 disposed at the position opposed to the ingot grinding unit 4 and can be stopped by the tray stopper 129 at the position opposed to the laser irradiation unit 6.

Figure 18:
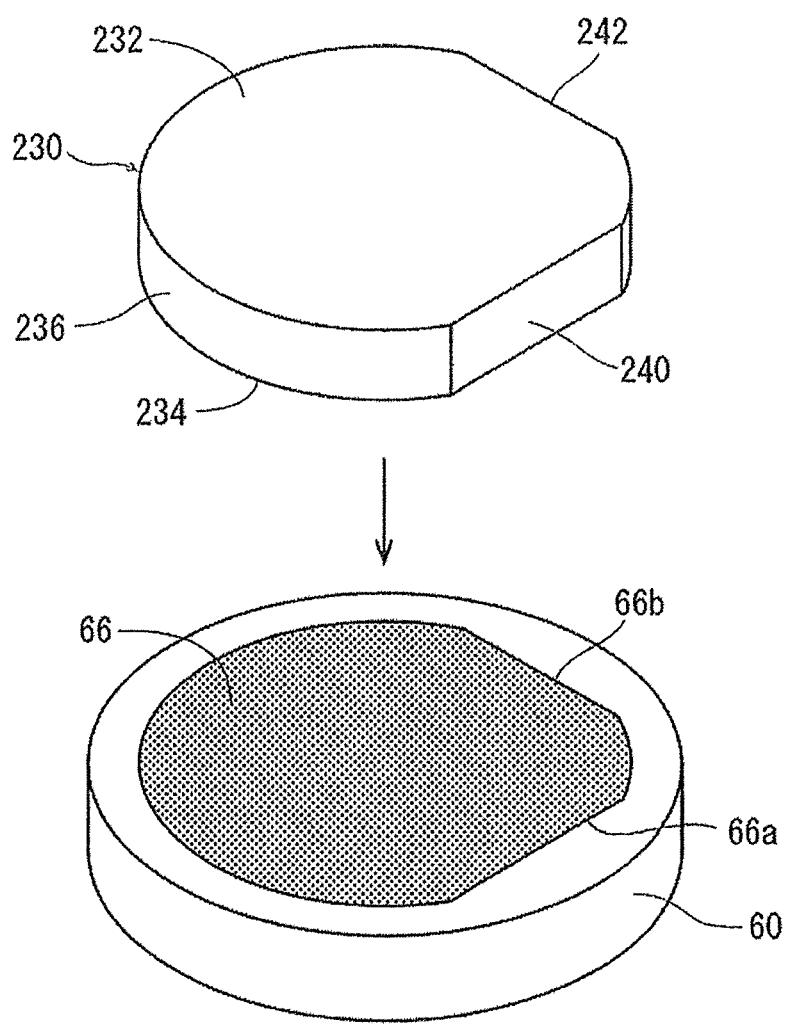
FIG. 18 is a perspective view depicting the state in which the ingot is being conveyed to a second holding table of the laser irradiation unit.

Subsequently, the rising-lowering plate 131 of the tray stopper 129 is raised to the separation position in order to separate the lower surface of the stopped tray 9 from the upper surfaces of the endless belts 127. Subsequently, the multi-joint arm 144 of the second transfer means 142 is driven and the suction adhesion piece 145 is brought into tight contact with the upper surface (in the present embodiment, first surface 232) of the ingot 230. Subsequently, the suction means connected to the suction adhesion piece 145 is actuated to produce a suction force for the suction adhesion piece 145 and the ingot 230 is sucked and held by the suction adhesion piece 145. Subsequently, the suction adhesion piece 145 is moved by the multi-joint arm 144 and, as depicted in FIG. 18, the lower surface (in the present embodiment, second surface 234) of the ingot 230 sucked and held by the suction adhesion piece 145 is brought into contact with the upper surface of the second holding table 60 of the laser irradiation unit 6. At this time, the second holding table 60 is positioned to the ingot attaching/detaching position (position depicted in FIG. 4) for attaching/detaching an ingot.

Furthermore, as is understood through reference to FIG. 18, a first straight line part 66a corresponding to the first orientation flat 240 of the ingot 230 and a second straight line part 66b corresponding to the second orientation flat 242 are formed at the circumferential edge of the circular suction adhesion chuck 66 of the present embodiment, and the ingot 230 in which the first orientation flat 240 and the second orientation flat 242 are formed can be sucked and held with a predetermined suction force by the suction adhesion chuck 66. Then, the suction means connected to the suction adhesion piece 145 is stopped to deactivate the suction force of the suction adhesion piece 145 and place the ingot 230 on the upper surface of the second holding table 60. In this manner, the first conveyance step of conveying the ingot 230 from the ingot stocker 11 to the laser irradiation unit 6 is executed. Although diagrammatic representation is omitted, a first straight line part corresponding to the first orientation flat 240 and a second straight line part corresponding to the second orientation flat 242 are formed also in the suction adhesion chuck 22 of the first holding table 14 of the ingot grinding unit 4 and the suction adhesion chuck 86 of the third holding table 80 of the wafer separating unit 8.

After the first conveyance step is executed, the separation layer forming step of holding the ingot 230 by the second holding table 60 and positioning the focal point of a laser beam with such a wavelength as to be transmitted through the ingot 230 to a depth corresponding to the thickness of the wafer to be produced from the upper surface of the ingot 230 held by the second holding table 60 and irradiating the ingot 230 with the laser beam to form a separation layer is executed by the laser irradiation unit 6.

Figure 19A:
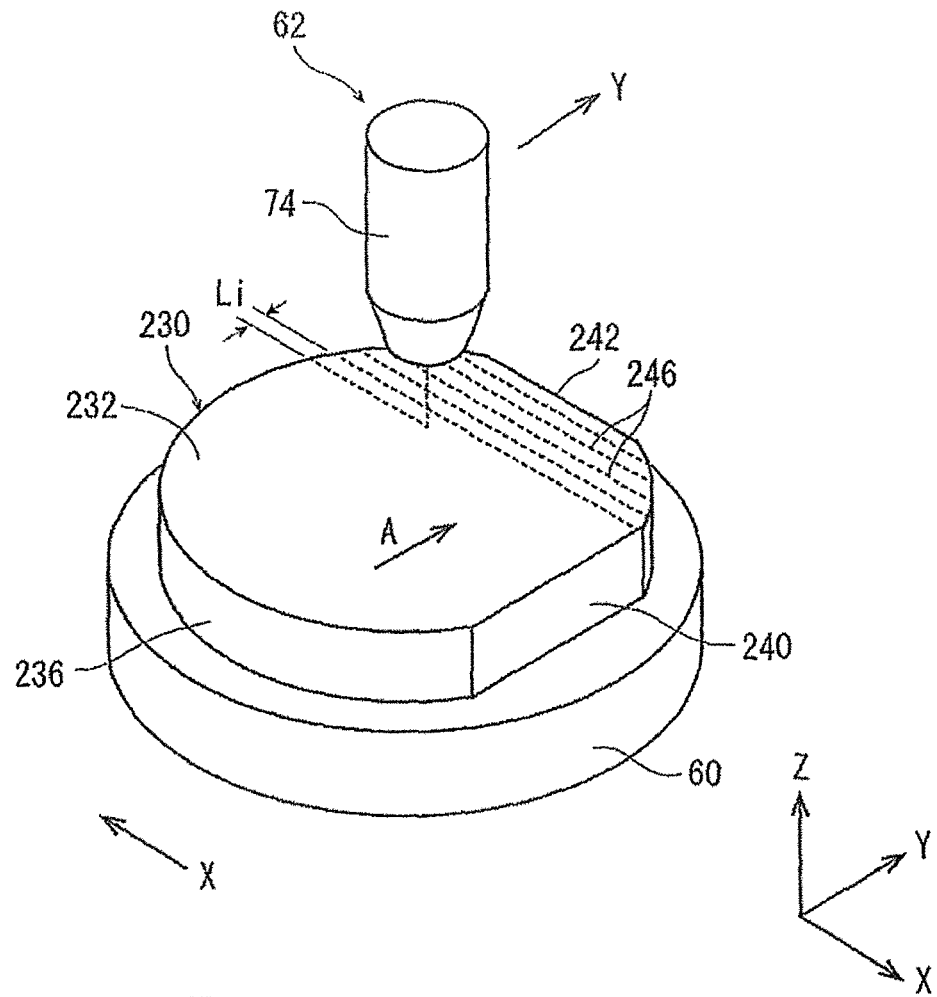
FIG. 19A is a perspective view depicting the state in which a separation layer forming step is being executed.

In the separation layer forming step, first, a suction force is produced for the upper surface of the second holding table 60 and the ingot 230 is sucked and held by the second holding table 60. Subsequently, the second holding table 60 is moved in the X-axis direction by the X-axis feed means and the Y-axis movable member is moved in the Y-axis direction by the Y-axis feed means to position the ingot 230 below the alignment means 76. Subsequently, the ingot 230 is imaged by the alignment means 76 from the upper side of the ingot 230. Subsequently, based on the image of the ingot 230 imaged by the alignment means 76, the second holding table 60 is rotated and moved by the motor for the second holding table and the X-axis feed means and the Y-axis movable member is moved by the Y-axis feed means. Thereby, the orientation of the ingot 230 is adjusted to a predetermined orientation and the positions of the ingot 230 and the light collector 74 in the XY-plane are adjusted. When the orientation of the ingot 230 is adjusted to the predetermined orientation, as depicted in FIG. 19A, the second orientation flat 242 is aligned with the X-axis direction. Thereby, the direction orthogonal to direction A in which the off-angle α is formed is aligned with the X-axis direction and direction A in which the off-angle α is formed is aligned with the Y-axis direction.

Figure 19B:
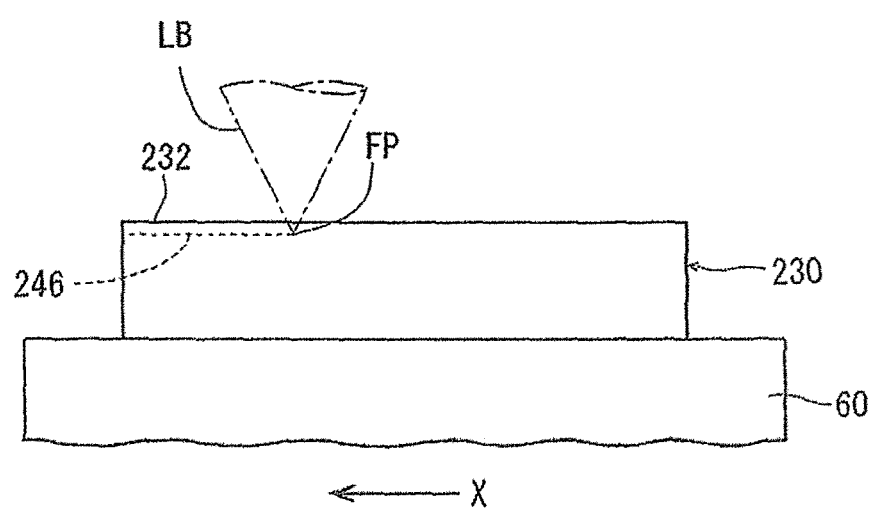
FIG. 19B is a front view depicting the state in which the separation layer forming step is being executed.
Figure 20A:
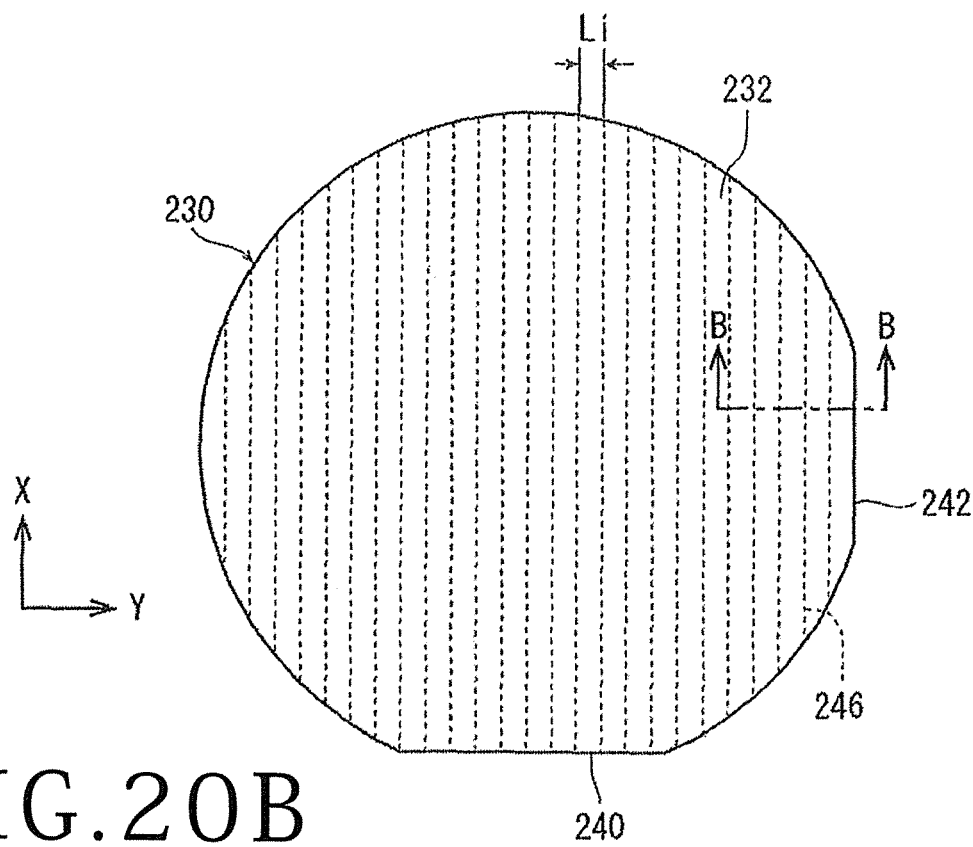
FIG. 20A is a plan view of the ingot in which a separation layer is formed.
Figure 20B:
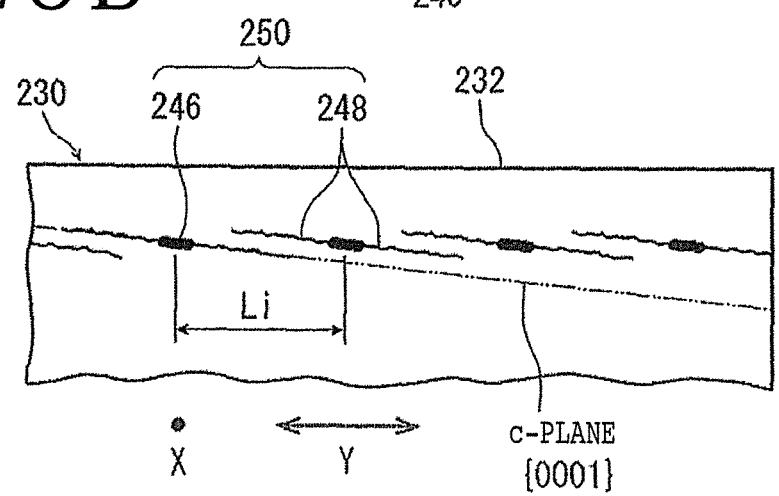
FIG. 20B is a sectional view along line B-B in FIG. 20A.

Subsequently, the light collector 74 is raised and lowered by the focal point position adjustment means and, as depicted in FIG. 19B, the focal point FP is positioned to a depth corresponding to the thickness of the wafer to be produced from the first surface 232 of the ingot 230. Subsequently, while the second holding table 60 is moved by the X-axis feed means in the X-axis direction aligned with the direction orthogonal to direction A in which the off-angle α is formed, the ingot 230 is irradiated with the pulse laser beam LB with such a wavelength as to be transmitted through the ingot 230 from the light collector 74. Due to this, as depicted in FIG. 20A and FIG. 20B, SiC is separated into Si and carbon (C) due to the irradiation with the pulse laser beam LB and the pulse laser beam LB with which irradiation is executed next is absorbed by the previously-formed C, so that SiC is separated into Si and C in a chain reaction manner. In addition, cracks 248 that isotropically extend along the c-plane from parts 246 at which SiC is separated into Si and C are produced.

Subsequently, by moving the Y-axis movable member by the Y-axis feed means, indexing feed of the focal point FP is executed relative to the ingot 230 in the Y-axis direction aligned with direction A in which the off-angle α is formed by a predetermined indexing amount Li within a range that does not exceed the width of the cracks 248. Furthermore, by alternately repeating the irradiation with the pulse laser beam LB and the indexing feed, plural splitting parts 246 that continuously extend in the direction orthogonal to direction A in which the off-angle α is formed are formed at intervals of the predetermined indexing amount Li in direction A in which the off-angle α is formed. In addition, the cracks 248 that isotropically extend along the c-plane from the splitting parts 246 are sequentially produced to cause the cracks 248 adjacent in direction A in which the off-angle α is formed to overlap as viewed in the upward-downward direction. Thereby, at the depth corresponding to the thickness of the wafer to be produced from the upper surface of the ingot 230, a separation layer 250 that is composed of the splitting parts 246 and the cracks 248 and at which the strength is lowered for separating a wafer from the ingot 230 can be formed. After the separation layer 250 is formed, the second holding table 60 is positioned to the ingot attaching-detaching position and the suction force of the second holding table 60 is deactivated. The separation layer forming step can be executed under the following processing condition, for example.

Wavelength of pulse laser beam: 1064 nm
Repetition frequency: 80 kHz
Average output power: 3.2 W
Pulse width: 4 ns
Diameter of focal point: 3 μm
Numerical aperture (NA) of collecting lens: 0.43
Position of focal point in Z-axis direction: 300 μm from upper surface of ingot
Feed speed of second holding table: 120 to 260 mm/s
Indexing amount: 250 to 400 μm After the separation layer forming step is executed, a second conveyance step of conveying the ingot 230 in which the separation layer 250 has been formed from the laser irradiation unit 6 to the wafer separating unit 8 is executed by the belt conveyor unit 10. In the second conveyance step, first, the multi-joint arm 144 of the second transfer means 142 is driven and the suction adhesion piece 145 is brought into tight contact with the first surface 232 of the ingot 230 on the second holding table 60 to suck and hold the ingot 230 by the suction adhesion piece 145. Subsequently, the suction adhesion piece 145 is moved by the multi-joint arm 144 and the second surface 234 of the ingot 230 sucked and held by the suction adhesion piece 145 is brought into contact with the ingot support part 117 of the tray 9. Subsequently, the suction force of the suction adhesion piece 145 is deactivated to cause the ingot support part 117 of the tray 9 to support the ingot 230. Subsequently, the tray 9 is placed on the endless belts 127 of the forward belt conveyor 121 by lowering the rising-lowering plate 131 of the tray stopper 129 from the separation position to the passing position.

After the forward belt conveyor 121 of the tray 9 is placed, the tray 9 is conveyed to the position opposed to the wafer separating unit 8 (in the present embodiment, ending point of the forward belt conveyor 121) by the forward belt conveyor 121. At this time, the rising-lowering plate 135 is positioned to a height with which the upper surface of the Y-axis movable plate 137 of the conveying means 123 is lower than the upper surfaces of the endless belts 127 of the forward belt conveyor 121 and the stopper piece 138 gets contact with the tray 9 that is being conveyed by the forward belt conveyor 121. In addition, the Y-axis movable plate 137 is positioned to the advancing position. This can bring the stopper piece 138 into contact with the tray 9 that is being conveyed in direction Y1 by the forward belt conveyor 121 and stop the tray 9 at the position opposed to the wafer separating unit 8.

Subsequently, the rising-lowering plate 135 of the conveying means 123 is raised to mount the stopped tray 9 on the upper surface of the Y-axis movable plate 137 and separate the lower surface of the tray 9 from the upper surfaces of the endless belts 127. Subsequently, the multi-joint arm 144 of the third transfer means 143 is driven and the suction adhesion piece 145 is brought into tight contact with the first surface 232 of the ingot 230 and the ingot 230 is sucked and held by the suction adhesion piece 145. Subsequently, the suction adhesion piece 145 is moved by the multi-joint arm 144 and the second surface 234 of the ingot 230 sucked and held by the suction adhesion piece 145 is brought into contact with the upper surface of the third holding table 80 of the wafer separating unit 8. At this time, the third holding table 80 is positioned to the ingot attaching-detaching position (position depicted in FIG. 6). Then, the suction force of the suction adhesion piece 145 is deactivated and the ingot 230 is placed on the upper surface of the third holding table 80. In this manner, the second conveyance step of conveying the ingot 230 from the laser irradiation unit 6 to the wafer separating unit 8 is executed.

After the second conveyance step is executed, a wafer separating step of holding the ingot 230 in which the separation layer 250 has been formed by the third holding table 80 and holding the upper surface of the ingot 230 held by the third holding table 80 to separate a wafer from the separation layer 250 is executed by the wafer separating unit 8.

Figure 21A:
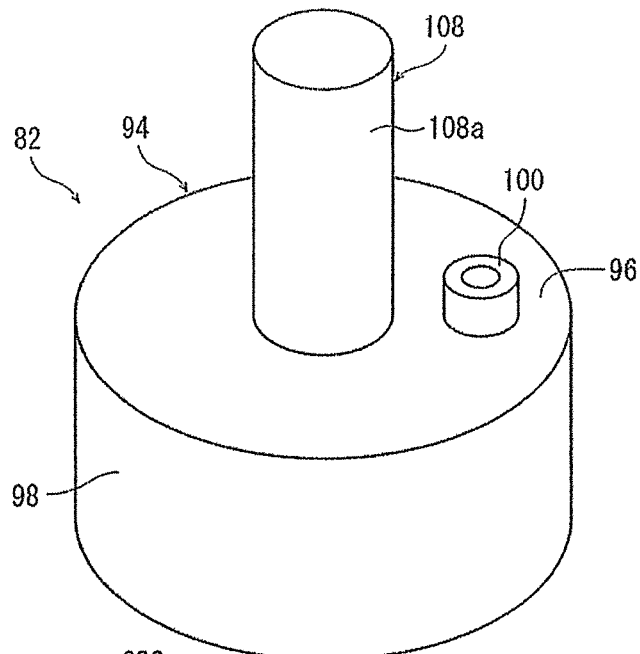
FIG. 21A is a perspective view depicting the state in which a liquid bath is located above a third holding table of the wafer separating unit.
Figure 21B:
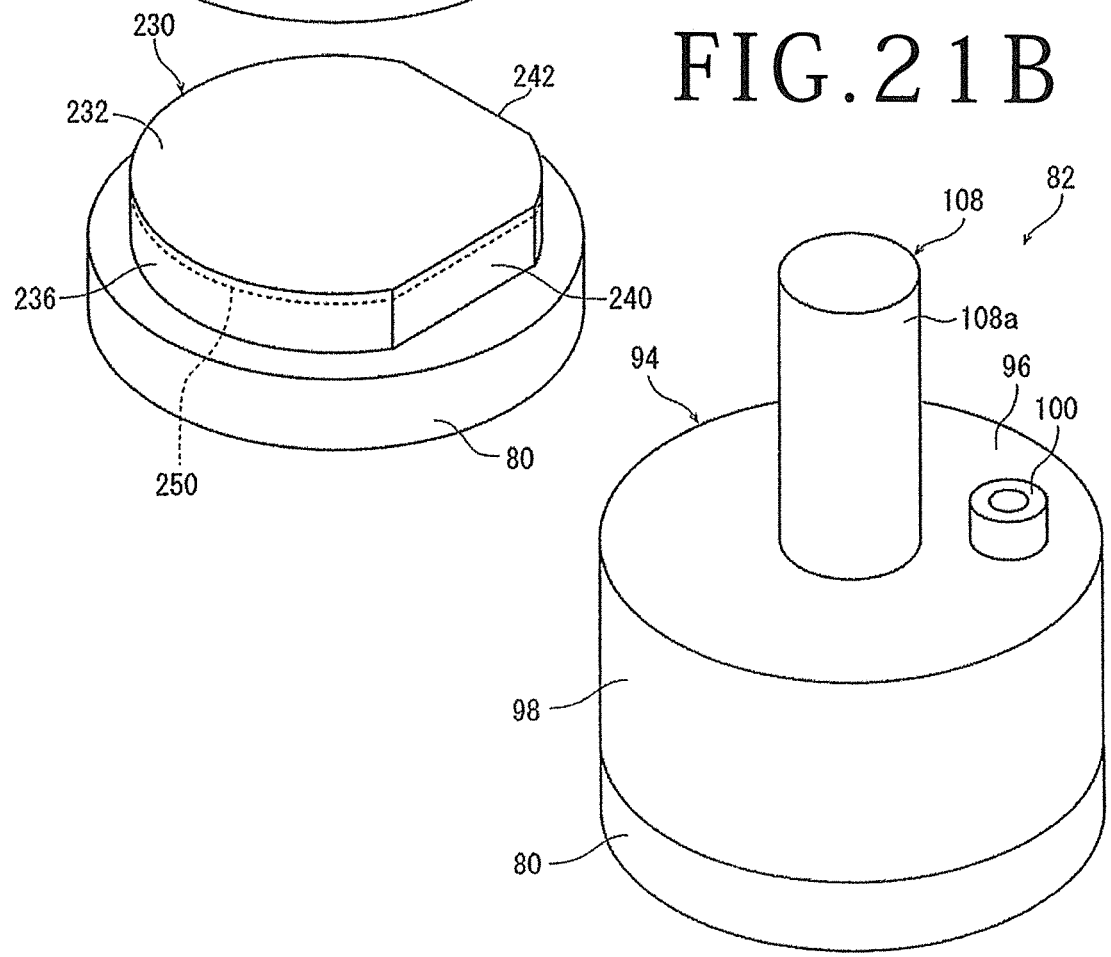
FIG. 21B is a perspective view depicting the state in which the lower end of the liquid bath is in contact with the upper surface of the third holding table.

In the wafer separating step, first, the ingot 230 is sucked and held by the third holding table 80. Subsequently, as depicted in FIG. 21A, the third holding table 80 is positioned to a wafer separating position below the liquid bath 94. Subsequently, the arm 92 is lowered by the arm moving means and the lower end of the skirt wall 98 of the liquid bath 94 is brought into tight contact with the upper surface of the third holding table 80 as depicted in FIG. 21B.

Subsequently, as depicted in FIG. 7, the piston rod 108*b* of the air cylinder 108 is moved and the lower surface of the suction adhesion piece 112 is brought into tight contact with the first surface 232 of the ingot 230. Subsequently, a suction force is produced for the lower surface of the suction adhesion piece 112 and the ingot 230 is sucked and held by the suction adhesion piece 112 from the side of the first surface 232. Subsequently, the liquid supply means connected to the liquid supply part 100 is actuated to supply the liquid 106 (for example, water) from the liquid supply part 100 to the liquid housing space 104 until the ultrasonic vibration producing member 110 is immersed. Subsequently, the ultrasonic vibration producing member 110 is actuated to give ultrasonic vibration to the ingot 230. Thereby, the separation layer 250 is stimulated and the cracks 248 are elongated to further lower the strength of the separation layer 250.

Figure 22:
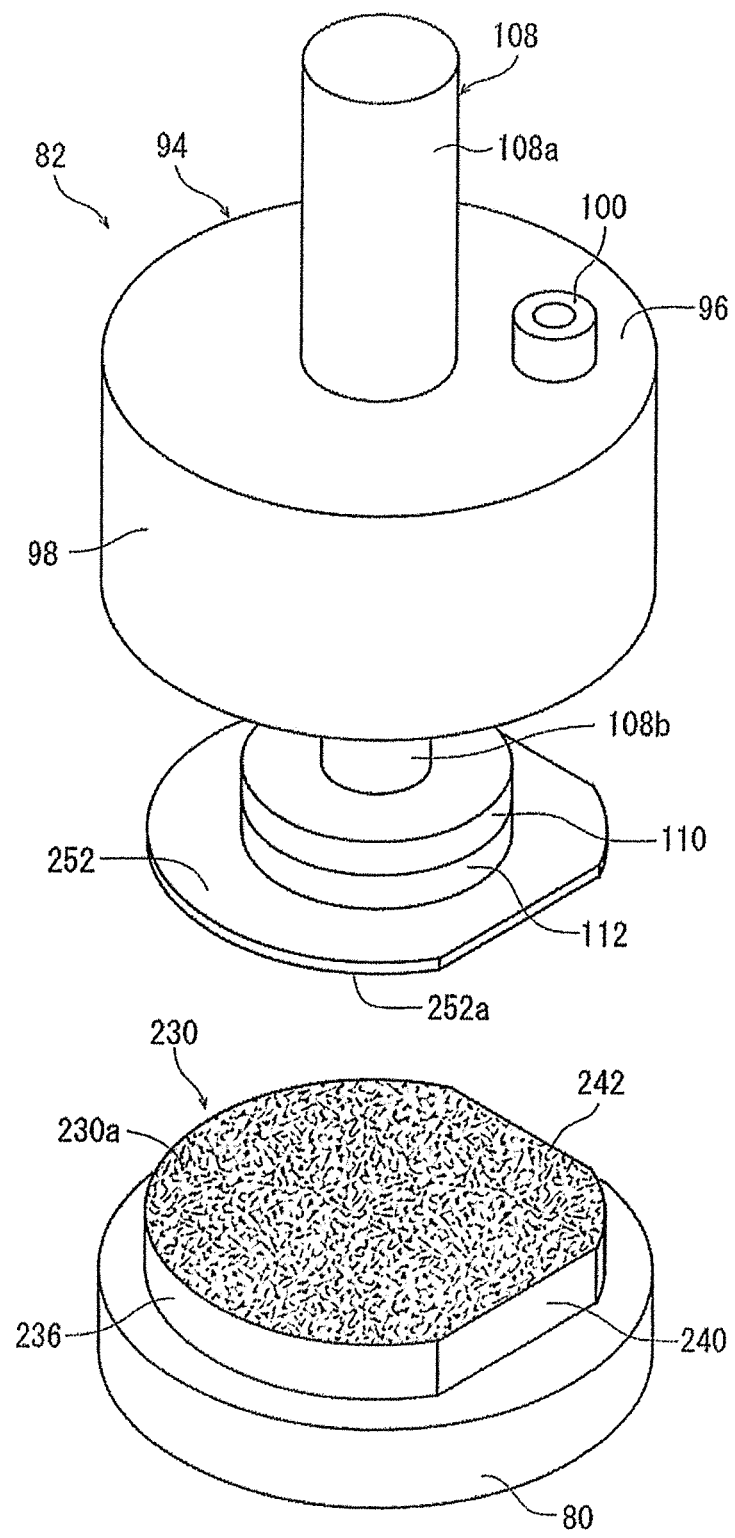
FIG. 22 is a perspective view depicting the state in which a wafer is separated from the ingot by the wafer separating unit.

Subsequently, by raising the arm 92 by the arm moving means in the state in which the ingot 230 is sucked and held by the suction adhesion piece 112, as depicted in FIG. 22, a wafer 252 to be produced can be separated from the ingot 230 by using the separation layer 250 as the point of origin. Furthermore, when the arm 92 is raised, the liquid 106 is discharged from the liquid housing space 104 and the liquid 106 is discharged to the outside of the wafer separating unit 8 through a discharge port (not depicted) formed in the base 84. After the wafer 252 is separated from the ingot 230, the third holding table 80 is positioned to the ingot attaching-detaching position and the suction force of the third holding table 80 is deactivated. When the ultrasonic vibration is given to the ingot 230, a gap (for example, 2 to 3 mm) may be made between the upper surface of the ingot 230 and the lower surface of the suction adhesion piece 112. Moreover, when the wafer 252 is separated from the ingot 230 by using the separation layer 250 as the point of origin, the wafer 252 may be separated from the ingot 230 by raising the suction adhesion piece 145 after the upper surface of the ingot 230 is sucked and held by the suction adhesion piece 145 of the third transfer means 143.

After the wafer separating step is executed, a third conveyance step of conveying the wafer 252 separated from the ingot 230 from the wafer separating unit 8 to the cassette 198 of the cassette stocker 200 and causing the wafer 252 to be housed is executed by the belt conveyor unit 10, the ingot delivery unit 12, and the housing means 202. In the third conveyance step, first, the multi-joint arm 144 of the third transfer means 143 is driven and the suction adhesion piece 145 of the third transfer means 143 is brought into tight contact with a separation surface 252*a* of the wafer 252 caused to adhere to the suction adhesion piece 112 of the wafer separating means 82 by suction, and the wafer 252 is sucked and held by the suction adhesion piece 145. Subsequently, the suction force of the suction adhesion piece 112 of the wafer separating means 82 is deactivated and the wafer 252 is passed from the suction adhesion piece 112 of the wafer separating means 82 to the suction adhesion piece 145 of the third transfer means 143. Subsequently, the suction adhesion piece 145 is moved by the multi-joint arm 144 and the wafer 252 sucked and held by the suction adhesion piece 145 is brought into contact with the wafer support part 118 of the tray 9. Subsequently, the suction force of the suction adhesion piece 145 is deactivated to cause the wafer support part 118 of the tray 9 to support the wafer 252.

Furthermore, in the third conveyance step, in order to convey the ingot 230 from which the wafer 252 has been separated from the wafer separating unit 8 to the ingot grinding unit 4 in conjunction with the conveyance of the wafer 252, the multi-joint arm 144 is driven and the suction adhesion piece 145 is brought into tight contact with a separation surface 230*a* of the ingot 230 on the third holding table 80 to suck and hold the ingot 230 by the suction adhesion piece 145. Subsequently, the suction adhesion piece 145 is moved by the multi-joint arm 144 and the ingot 230 sucked and held by the suction adhesion piece 145 is conveyed to the ingot support part 117 of the tray 9 to cause the ingot support part 117 to support the ingot 230. Subsequently, the Y-axis movable plate 137 of the conveying means 123 on which the tray 9 is mounted is positioned to the retreating position. Subsequently, the rising-lowering plate 135 is lowered and the upper surface of the Y-axis movable plate 137 is positioned to the slightly upper side relative to the upper surfaces of the endless belts 127 of the backward belt conveyor 122. Subsequently, the tray 9 is placed on the endless belts 127 of the backward belt conveyor 122 by positioning the Y-axis movable plate 137 to the advancing position and lowering the rising-lowering plate 135.

After the tray 9 is placed on the backward belt conveyor 122, the tray 9 is conveyed to the ending point of the backward belt conveyor 122 by the backward belt conveyor 122. At this time, the upper surface of the receiving table 160 is set to the same height as the upper surfaces of the endless belts 127 of the backward belt conveyor 122 by the elevator 168 of the ingot delivery unit 12. In addition, the second endless belts 162 are rotated by the motor 164 in such a manner that the upper surface side of the second endless belts 162 travels in direction Y2. Thereby, the tray 9 that is being conveyed in direction Y2 by the backward belt conveyor 122 is placed on the upper surface of the receiving table 160.

After the tray 9 is placed on the receiving table 160, the rotation of the motor 164 is stopped. In addition, the rising-lowering plate 186 of the elevator 168 is moved and the upper surface of the receiving table 160 on which the tray 9 is placed is set to the same height as the upper surfaces of the endless belts 127 of the forward belt conveyor 121 of the belt conveyor unit 10. At this time, the piston rod 174*b* of the air cylinder 174 is positioned to the contracting position in order to prevent inhibition of movement of the rising-lowering plate 186. Subsequently, by moving the rising-lowering block 212 by the X-axis feed means 210 and the raising-lowering means 214 of the housing means 202 and driving the multi-joint arm 216, the holding piece 218 is brought into tight contact with the upper surface of the wafer 252 supported by the tray 9 on the receiving table 160 and the wafer 252 is sucked and held by the holding piece 218. Then, by moving the holding piece 218 by the X-axis feed means 210, the raising-lowering means 214, and the multi-joint arm 216, the wafer 252 sucked and held by the holding piece 218 is carried out from the tray 9 and is moved into the cassette 198 of the cassette stocker 200. Then, the suction force of the holding piece 218 is deactivated. In this manner, the wafer 252 separated from the ingot 230 is conveyed from the wafer separating unit 8 to the cassette 198 of the cassette stocker 200 and is housed.

After the wafer 252 is carried out from the tray 9, the second endless belts 162 are rotated to deliver the tray 9 placed on the upper surface of the receiving table 160 to the forward belt conveyor 121 and convey the tray 9 by the forward belt conveyor 121. At this time, the rising-lowering plate 131 of the tray stopper 129 disposed at the position opposed to the ingot grinding unit 4 is positioned to the stop position. This can stop the tray 9 that is being conveyed in direction Y1 by the forward belt conveyor 121 by the tray stopper 129 at the position opposed to the ingot grinding unit 4.

Subsequently, the rising-lowering plate 131 of the tray stopper 129 is raised to the separation position in order to separate the lower surface of the stopped tray 9 from the upper surfaces of the endless belts 127. Subsequently, the multi-joint arm 144 of the first transfer means 141 is driven and the suction adhesion piece 145 is brought into tight contact with the separation surface 230a of the ingot 230 to suck and hold the ingot 230 by the suction adhesion piece 145. Subsequently, the suction adhesion piece 145 is moved by the multi-joint arm 144 and the second surface 234 of the ingot 230 is brought into contact with the upper surface of the first holding table 14 of the ingot grinding unit 4 positioned to the ingot attaching-detaching position. Then, the suction force of the suction adhesion piece 145 is deactivated and the ingot 230 is placed on the upper surface of the first holding table 14. In this manner, the ingot 230 from which the wafer 252 has been separated is conveyed from the wafer separating unit 8 to the ingot grinding unit 4.

After the third conveyance step is executed, an ingot grinding step of holding the ingot 230 from which the wafer 252 has been separated by the first holding table 14 and grinding the separation surface 230a of the ingot 230 held by the first holding table 14 to planarize the separation surface 230a is executed by the ingot grinding unit 4.

Referring to FIG. 3, in the ingot grinding step, first, a suction force is produced for the upper surface of the first holding table 14 and the ingot 230 is sucked and held by the first holding table 14. Subsequently, the first holding table 14 that holds the ingot 230 is positioned to the grinding position. Subsequently, the first holding table 14 that holds the ingot 230 is rotated at a predetermined rotational speed (for example, 300 rpm) in an anticlockwise manner as viewed from above. Furthermore, the spindle 36 is rotated at a predetermined rotational speed (for example, 6000 rpm) in an anticlockwise manner as viewed from above. Subsequently, the spindle housing 30 is lowered and the grinding abrasives 44 are brought into contact with the separation surface 230a of the ingot 230. Thereafter, the spindle housing 30 is lowered at a predetermined grinding feed speed (for example, 1.0 μm/s). This can grind the separation surface 230a of the ingot 230 from which the wafer 252 has been separated and planarize the separation surface 230a of the ingot 230 to such an extent that the incidence of the pulse laser beam LB in the separation layer forming step is not hindered. After the separation surface 230a of the ingot 230 is planarized, the first holding table 14 that holds the ingot 230 is positioned to the ingot attaching-detaching position and the suction force of the first holding table 14 is deactivated.

After the ingot grinding step is executed, a fourth conveyance step of conveying the ingot 230 in which the separation surface 230a has been planarized from the ingot grinding unit 4 to the laser irradiation unit 6 is executed by the belt conveyor unit 10. In the fourth conveyance step, first, the multi-joint arm 144 of the first transfer means 141 is driven and the suction adhesion piece 145 is brought into tight contact with the separation surface 230a of the ingot 230 on the first holding table 14 to suck and hold the ingot 230 by the suction adhesion piece 145. Subsequently, the suction adhesion piece 145 is moved by the multi-joint arm 144 and the second surface 234 of the ingot 230 sucked and held by the suction adhesion piece 145 is brought into contact with the ingot support part 117 of the tray 9. Subsequently, the suction force of the suction adhesion piece 145 is deactivated to cause the ingot support part 117 of the tray 9 to support the ingot 230. Subsequently, the tray 9 is placed on the endless belts 127 of the forward belt conveyor 121 by lowering the rising-lowering plate 131 of the tray stopper 129 from the separation position to the passing position.

After the tray 9 is placed on the forward belt conveyor 121, the tray 9 is conveyed to the position opposed to the laser irradiation unit 6 by the forward belt conveyor 121. At this time, the rising-lowering plate 131 of the tray stopper 129 disposed at the position opposed to the laser irradiation unit 6 is positioned to the stop position and the tray 9 that is being conveyed in direction Y1 by the forward belt conveyor 121 is stopped by the tray stopper 129 at the position opposed to the laser irradiation unit 6. Subsequently, the rising-lowering plate 131 of the tray stopper 129 is raised to the separation position in order to separate the lower surface of the stopped tray 9 from the upper surfaces of the endless belts 127. Subsequently, the multi-joint arm 144 of the second transfer means 142 is driven and the suction adhesion piece 145 is brought into tight contact with the separation surface 230a of the ingot 230 to suck and hold the ingot 230 by the suction adhesion piece 145. Subsequently, the multi-joint arm 144 of the second transfer means 142 is driven and the suction adhesion piece 145 is brought into tight contact with the separation surface 230a of the ingot 230 to suck and hold the ingot 230 by the suction adhesion piece 145. Subsequently, the suction adhesion piece 145 is moved by the multi-joint arm 144 and the second surface 234 of the ingot 230 sucked and held by the suction adhesion piece 145 is brought into contact with the upper surface of the second holding table 60 of the laser irradiation unit 6 position to the ingot attaching-detaching position. Then, the suction force of the suction adhesion piece 145 is deactivated and the ingot 230 is placed on the upper surface of the second holding table 60. In this manner, the fourth conveyance step of conveying the ingot 230 in which the separation surface 230a has been planarized from the ingot grinding unit 4 to the laser irradiation unit 6 is executed.

After the fourth conveyance step is executed, the above-described separation layer forming step is executed by the laser irradiation unit 6. Furthermore, by repeatedly executing the separation layer forming step, the wafer separating step, the ingot grinding step, and the second to fourth conveyance steps, the wafers 252 in such a quantity as to be allowed to be produced are produced from the ingot 230 and the wafers 252 are housed in the cassette 198 of the cassette stocker 200.

The respective steps executed for the ingot 230 in the wafer producing apparatus 2 are described above, with attention paid to one ingot 230. However, in the wafer producing apparatus 2, the wafers 252 in such a quantity as to be allowed to be produced can be produced from the plural ingots 230 by, after executing the first conveyance step of conveying the ingot 230 from the ingot stocker 11 to the laser irradiation unit 6, repeatedly executing the first conveyance step at appropriate intervals and repeatedly executing the separation layer forming step, the wafer separating step, the ingot grinding step, and the second to fourth conveyance steps for plural (in the present embodiment, four) ingots 230 concurrently. Furthermore, if the quantity of wafers 252 produced from one ingot 230 is 100, for example, the wafers 252 are housed in four cassettes 198 in which 25 wafers 252 can be housed. On this occasion, by giving an identification (ID) to identify the tray 9 to the tray 9 and setting reading means that reads the ID of the tray 9 in the wafer producing apparatus 2, the produced wafers 252 can be housed in the cassette 198 with classification into each ingot 230.

As described above, the wafer producing apparatus 2 in the present embodiment is composed of at least the following components: the ingot grinding unit 4 composed of at least the first holding table 14 that holds the ingot 230 and the grinding means 16 that grinds the upper surface of the ingot 230 held by the first holding table 14 to planarize the upper surface; the laser irradiation unit 6 composed of at least the second holding table 60 that holds the ingot 230 and the laser irradiation means 62 that positions the focal point FP of the laser beam LB with such a wavelength as to be transmitted through the ingot 230 to a depth corresponding to the thickness of the wafer 252 to be produced from the upper surface of the ingot 230 held by the second holding table 60 and irradiates the ingot 230 with the laser beam LB to form the separation layer 250; the wafer separating unit 8 composed of at least the third holding table 80 that holds the ingot 230 and the wafer separating means 82 that holds the upper surface of the ingot 230 held by the third holding table 80 and separates the wafer 252 from the separation layer 250; the tray 9 including the ingot support part 117 that supports the ingot 230 and the wafer support part 118 that supports the separated wafer 252; the belt conveyor unit 10 that conveys the ingot 230 supported by the tray 9 among the ingot grinding unit 4, the laser irradiation unit 6, and the wafer separating unit 8; the ingot stocker 11 in which the ingot 230 supported by the tray 9 is housed; and the ingot delivery unit 12 that delivers the ingot 230 supported by the tray 9 housed in the ingot stocker 11 to the belt conveyor unit 10. Therefore, a series of work of producing the wafer 252 from the ingot 230 can be automatically executed and the production efficiency is improved.

Furthermore, in the wafer producing apparatus 2 of the present embodiment, each unit is independently configured. Therefore, the quantity of each unit can be changed according to conditions of the ingot, such as material and size, user's demands, and so forth. For example, when the wafer producing apparatus 2 includes plural units as each kind of unit, the same step can be concurrently executed and the quantity of wafers produced per unit time can be increased. Moreover, in the wafer producing apparatus 2, by disposing a larger number of units with which it takes a comparatively-long time to execute a step than the number of units with which a step can be executed in a comparatively-short time, it is also possible to suppress stagnation of progression of the step and improve the production efficiency.

In the separation layer forming step of the present embodiment, the example is described in which the ingot 230 is moved relative to the focal point FP in the direction orthogonal to direction A in which the off-angle α is formed in irradiation with the laser beam LB and the focal point FP is moved relative to the ingot 230 in direction A in which the off-angle α is formed in indexing feed. However, the direction of the relative movement of the focal point FP and the ingot 230 in irradiation with the laser beam LB does not have to be the direction orthogonal to direction A in which the off-angle α is formed. In addition, the direction of the relative movement of the focal point FP and the ingot 230 in indexing feed does not have to be direction A in which the off-angle α is formed.

Furthermore, if desired, a wafer grinding unit that grinds the separation surface 252a of the wafer 252 separated from the ingot 230 to planarize the separation surface 252a may be disposed and the wafer 252 may be housed in the cassette 198 after the separation surface 252a of the wafer 252 is planarized by the wafer grinding unit. Moreover, a cleaning unit that cleans the ingot 230 ground by the ingot grinding unit 4 and the wafer 252 ground by the wafer grinding unit may be disposed.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer producing apparatus that produces a wafer from an ingot, the wafer producing apparatus comprising:
   an ingot grinding unit including: (i) a first holding table that holds the ingot and (ii) grinding means that grinds an upper surface of the ingot held by the first holding table to planarize the upper surface;
   a laser irradiation unit including: (i) a second holding table that holds the ingot and (ii) laser irradiation means that: (a) positions a focal point of a laser beam with such a wavelength as to be transmitted through the upper surface of the ingot to a depth corresponding to a thickness of a wafer to be produced from the upper surface of the ingot held by the second holding table and (b) irradiates the ingot with the laser beam to form a separation layer;
   a wafer separating unit including: (i) a third holding table that holds the ingot and (ii) wafer separating means that holds the upper surface of the ingot held by the third holding table and separates a wafer from the separation layer;
   a tray including: (i) an ingot support part that supports the ingot and (ii) a wafer support part that supports the separated wafer;
   a belt conveyor unit that conveys the ingot supported by the tray among the ingot grinding unit, the laser irradiation unit, and the wafer separating unit;
   an ingot stocker in which the ingot supported by the tray is housed; and
   an ingot delivery unit that delivers the ingot supported by the tray housed in the ingot stocker to the belt conveyor unit.

2. The wafer producing apparatus according to claim 1, wherein
   the ingot stocker includes a plurality of placement tables, each of the placement tables configured for receiving the tray that supports the ingot, each of the placement comprising a respective first endless belt that is disposed in the corresponding placement table and that sends out the tray that supports the ingot, a respective driving force transmitting part that is joined to the corresponding first endless belt and that transmits a respective driving force, and the ingot stocker further including a rack in which a plurality of the placement tables are disposed vertically one above another, and
   the ingot delivery unit includes a receiving table that receives the tray that supports the ingot from one of the placement tables, a second endless belt that is disposed in the receiving table and delivers the tray that supports the ingot to the belt conveyor unit, a motor that drives the second endless belt, a clutch part that is joined to the second endless belt and that transmits a driving force to the driving force transmitting part of the one of the placement tables, and an elevator that positions the receiving table next to any of the placement tables disposed vertically one above another.

3. The wafer producing apparatus according to claim 1, further comprising:

a cassette stocker in which is housed a plurality of cassettes, wherein each of the cassettes houses a plurality of the separated wafers; and housing means that causes the wafer supported by the wafer support part of the tray to be removed from the tray and to be housed in one of the cassettes housed in the cassette stocker.

* * * * *